(12) United States Patent
Kim et al.

(10) Patent No.: US 12,372,836 B2
(45) Date of Patent: *Jul. 29, 2025

(54) DISPLAY APPARATUS

(71) Applicant: SAMSUNG ELECTRONICS CO., LTD., Suwon-si (KR)

(72) Inventors: Sungyeol Kim, Suwon-si (KR); Chunsoon Park, Suwon-si (KR); Seungyong Shin, Suwon-si (KR); Hyukjun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

This patent is subject to a terminal disclaimer.

(21) Appl. No.: 18/374,397

(22) Filed: Sep. 28, 2023

(65) Prior Publication Data

US 2024/0184169 A1 Jun. 6, 2024

Related U.S. Application Data

(63) Continuation of application No. PCT/KR2023/013291, filed on Sep. 6, 2023.

(30) Foreign Application Priority Data

Dec. 5, 2022 (KR) .................. 10-2022-0168041

(51) Int. Cl.
*G02F 1/1345* (2006.01)
*G02F 1/13357* (2006.01)
*G02F 1/1362* (2006.01)

(52) U.S. Cl.
CPC .... *G02F 1/13452* (2013.01); *G02F 1/133603* (2013.01); *G02F 1/136286* (2013.01)

(58) Field of Classification Search
CPC .......... G02F 1/13452; G02F 1/133603; G02F 1/136286

See application file for complete search history.

(56) References Cited

U.S. PATENT DOCUMENTS 11,373,605 B1 6/2022 Kim et al.
11,775,110 B2 10/2023 Zhu et al.
(Continued)

FOREIGN PATENT DOCUMENTS

CN 102810525 B 4/2016
CN 211044904 U 7/2020
(Continued)

OTHER PUBLICATIONS

International Search Report and Written Opinion (PCT/ISA/220, PCT/ISA/210, and PCT/ISA/237) dated Dec. 18, 2023, issued by International Searching Authority for International Application No. PCT/KR2023/013291.

*Primary Examiner* — Michael H Caley
*Assistant Examiner* — David Y Chung
(74) *Attorney, Agent, or Firm* — Sughrue Mion, PLLC

(57) ABSTRACT

A display apparatus includes a display panel; and a backlight unit configured to provide light to the display panel. The backlight unit includes: a substrate including a first surface facing the display panel; a light source disposed on the first surface; a driving element disposed on the first surface to drive the light source; a plurality of lines provided on the first surface; and at least one jumper connector disposed on the first surface. Each of the at least one jumper connector corresponds to a first line and a second line of the plurality of lines, such that the jumper connector is disposed in a crossing region of the first surface at which the first line crosses the second line, and the jumper connector electri- (Continued)

cally connects with the first line and guides the second line to be spaced apart from the first line.

18 Claims, 22 Drawing Sheets

(56) References Cited

U.S. PATENT DOCUMENTS

| | | | |
|---|---|---|---|
| 12,092,924 B2* | 9/2024 | Jang | G02F 1/133603 |
| 2018/0033853 A1* | 2/2018 | Bower | H10K 59/35 |
| 2022/0180830 A1* | 6/2022 | Kim | G02F 1/133601 |
| 2022/0413341 A1 | 12/2022 | Kim et al. | |
| 2023/0205021 A1 | 6/2023 | Kim et al. | |

FOREIGN PATENT DOCUMENTS

| | | |
|---|---|---|
| CN | 217135762 U | 8/2022 |
| KR | 10-2008-0020324 A | 3/2008 |
| KR | 20-2008-0005067 U | 10/2008 |
| KR | 10-1705216 B1 | 2/2017 |
| KR | 10-2022-0045479 A | 4/2022 |
| KR | 10-2022-0139269 A | 10/2022 |
| KR | 10-2022-0148082 A | 11/2022 |

* cited by examiner

DISPLAY APPARATUS

CROSS-REFERENCE TO RELATED APPLICATIONS

This application is a bypass continuation application of International Patent Application No. PCT/KR2023/013291, filed on Sep. 6, 2023, which is based on and claims priority to Korean Patent Application No. 10-2022-0168041, filed on Dec. 5, 2022 with the Korean Intellectual Property Office, the disclosures of each of which are incorporated by reference herein in their entireties.

BACKGROUND

1. Field

The disclosure relates to a display apparatus, and more specifically, to a display apparatus with an enhanced efficiency of production process.

2. Description of Related Art

Generally, a display apparatus is a kind of an output apparatus that converts obtained or stored electrical information into visual information and displays the visual information to a user, and the display apparatus is used in various fields, such as home or workplace.

The display apparatus includes a monitor apparatus connected to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone, various display apparatuses used to reproduce images, such as advertisements or movies in an industrial field, or various kinds of audio/video systems.

The display apparatus (regardless of whether a self-emissive display or a non-emissive display) includes a light source device to convert electrical information into visual information, and the light source device includes a plurality of light sources configured to independently emit light. Each of the plurality of light sources includes an LED or an organic light emitting diode (OLED).

Driving elements and light sources (e.g., light emitting diodes) may be fixed on a light source substrate using surface mount technology (SMT). In addition, a line (a wire) for transmitting and receiving electrical signals by connecting the driving elements and the light sources may be wired.

A substrate includes an insulation layer and a conduction layer, and may have two outer surfaces. Conventionally, the outer surface of the substrate on which a light source and a driving element are mounted is different from the outer surface of the substrate on which a connector and a capacitor are mounted, and thus there is a demand for increasing the efficiency of a production process in manufacturing a light source device.

SUMMARY

Therefore, it is an aspect of the disclosure to provide a display apparatus capable of improving the efficiency of a production process.

The technical objectives of the disclosure are not limited to the above, and other objectives may become apparent to those of ordinary skill in the art based on the following descriptions.

In accordance with an aspect of the disclosure, there is provided a display apparatus including: a display panel; and a backlight unit configured to provide light to the display panel. The backlight unit includes: a substrate including a first surface facing the display panel; a light source disposed on the first surface; a driving element disposed on the first surface to drive the light source; a plurality of lines provided on the first surface, the plurality of lines including a scan line providing a scan signal to the driving element, a data line providing a data signal to the driving element, a power supply line providing a power signal to the light source, and an out-line providing a signal from the driving element to the light source, and at least one jumper connector is disposed on the first surface. Each of the at least one jumper connector corresponds to a first line and a second line of the plurality of lines, such that the jumper connector is disposed in a crossing region of the first surface at which the first line crosses the second line, and the jumper connector electrically connects with the first line and guides the second line to be spaced apart from the first line.

The at least one jumper connector may include a first jumper connector. One line of the data line and the scan line may be the first line corresponding to the first jumper connector, and an other line of the data line and the scan line may be the second line corresponding to the first jumper connector.

The at least one jumper connector may further include a second jumper connector. One line of the power supply line and the scan line may be the first line corresponding to the second jumper connector, and an other line of the power supply line and the scan line may be the second line corresponding to the second jumper connector.

The at least one jumper connector may further include a third jumper connector. One line of the power supply line and the data line may be the first line corresponding to the third jumper connector, and an other line of the power supply line and the data line may be the second line corresponding to the third jumper connector.

The substrate may include an insulation layer and a conduction layer stacked on the insulation layer, the data line may pass between the first jumper connector and the insulation layer, and the scan line may be wired in the first jumper connector.

The power supply line may pass between the second jumper connector and the insulation layer, and the scan line may be wired in the second jumper connector.

The power supply line may pass between the third jumper connector and the insulation layer, and the data line may be wired in the third jumper connector.

The substrate may include an insulation layer and a conduction layer stacked on a surface of the insulation layer, a ground may be formed on one surface of the insulation layer on which the conduction layer may be stacked, and the ground may be disposed between the insulation layer and the jumper connector.

The substrate may include an insulation layer and a conduction layer stacked on the insulation layer, the scan line may pass between the first jumper connector and the insulation layer, and the data line may be wired in the first jumper connector.

The scan line may pass between the second jumper connector and the insulation layer, and the power supply line may be wired in the second jumper connector.

The data line may pass between the third jumper connector and the insulation layer, and the power supply line may be wired in the third jumper connector.

Each of the at least one jumper connector may include: a body; and a wire portion formed in the body to electrically connect one of the lines. The wire portion may include a first point connected to a first portion of the first line corresponding to the jumper connector, a second point connected to a second portion of the first line corresponding to the jumper connector, and a connection portion formed inside the body to electrically connect the first point and the second point.

The first line corresponding to the jumper connector may be disconnected and divided into the first portion and the second portion, and the first portion and the second portion of the first line corresponding to the jumper connector may be electrically connected by the jumper connector.

The display apparatus may further include a reflective sheet disposed on the first surface of the substrate to cover the at least one jumper. An air discharge portion may be formed on the reflective sheet and configured to eliminate a space separating the reflective sheet and the at least one jumper connector.

Each of the at least one jumper connector may include a body including a front surface facing the display panel, and the air discharge portion may be formed in an area of the reflective sheet corresponding to the front surface of the body of the at least one jumper connector.

The substrate may include an insulation layer and a conduction layer stacked on the insulation layer. A space may be formed in the conduction layer of the substrate between the at least one jumper connector and the insulation layer, a first portion and a second portion of the first line may be disposed on opposite sides of the space, and the second line corresponding to the at least one jumper connector may be disposed in the space.

In accordance with an aspect of the disclosure, there is provided a display apparatus including: a display panel and a light source device configured to provide light to the display panel, wherein the light source device includes: a first light source; a second light source; a first driving element configured to supply a driving signal to the first light source; a second driving element configured to supply a driving signal to the second light source; a substrate including an insulation layer and a conduction layer stacked on the insulation layer and in which the first light source, the second light source, the first driving element, and the second driving element are electrically connected; lines formed in the conductive line and including a first scan line provided in the conduction layer and configured to provide a scan signal to the first driving element, a first data line configured to provide a data signal to the first driving element, a second scan line configured to provide a scan signal to the second driving element, and a second data line configured to provide a data signal to the second driving element; and a jumper connector disposed in a portion of the conduction layer at which one of the lines crosses an other one of the lines, wherein the jumper connector configured to electrically connect one of the lines, and an other one of the lines is spaced apart from the insulation layer to be disposed between the jumper connector and the insulation layer.

The one of the lines may be disconnected and divided into a first portion and a second portion, and the first portion and the second portion of the one of the lines may be electrically connected by the jumper connector.

The jumper connector may include: a body; and a wire portion formed in the body to electrically connect the first portion and the second portion of the one of the lines, wherein the wire portion may include a first point connected to the first portion, a second point connected to the second portion, and a connection portion formed inside the body to connect the first point and the second point.

In accordance with an aspect of the disclosure, there is provided a display apparatus including: a display panel configured to display image information in a forward direction and a backlight unit disposed on a rear side of the display panel, wherein the backlight unit includes: a substrate including an insulation layer including a front surface and a rear surface on a side opposite to the front surface and a conduction layer stacked on the front surface of the insulation layer; a light source disposed on the conduction layer; a driving element disposed on the conduction layer to drive the light source; lines provided in the conduction layer, and including a scan line providing a scan signal to the driving element, a data line providing a data signal to the driving element, and a power supply line providing a power signal to the light source; and a jumper connector disposed on the conduction layer and spaced apart from the insulation layer by a predetermined distance, the jumper connector including a first jumper connector connecting the scan line, a second jumper connector connecting the power supply line, and a third jumper connector connecting the data line, wherein the data line passes through an area between the first jumper connector and the insulation layer, the scan line passes through an area between the second jumper connector and the insulation layer, and the power supply line passes through an area between the third jumper connector and the insulation layer.

The display apparatus may further include a reflective sheet attached to a front surface of the substrate to cover the jumper connector, wherein the jumper connector may include a body having a front surface facing the display panel, and an air discharge portion may be formed in an area of the reflective sheet corresponding to the front surface of the body to prevent the reflective sheet and the jumper connector from being separated from each other.

According to one aspect of the disclosed disclosure, a display apparatus capable of increasing the efficiency of a production process by mounting various components while wiring lines on one side of a light source substrate is provided.

The effects of the disclosure are not limited to the effects described above, and other effects that are not described will be clearly understood by those skilled in the art from the following description.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
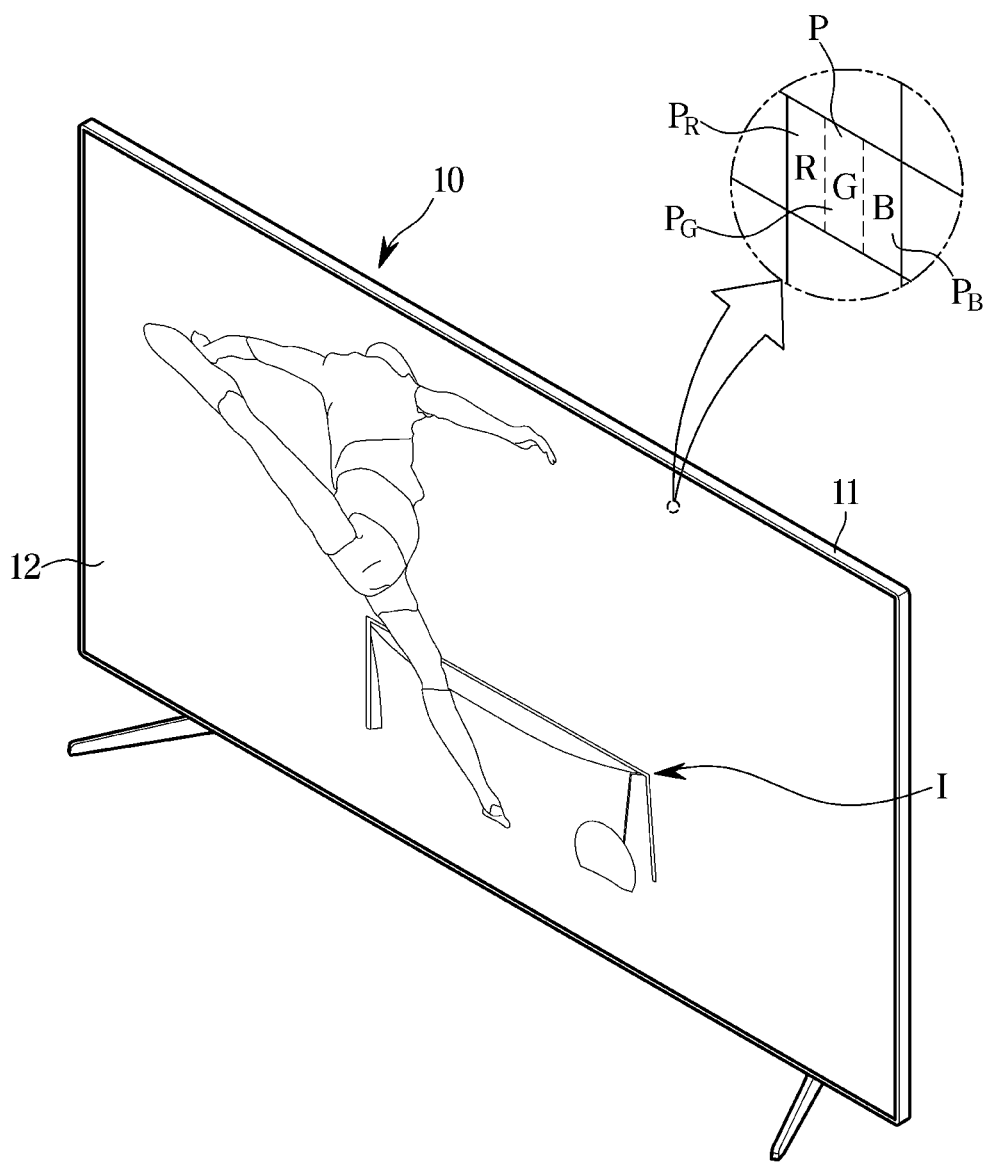
FIG. 1 is a perspective view illustrating a display apparatus, according to an embodiment of the disclosure.
Figure 1:
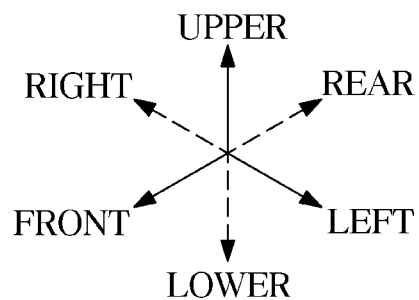

The embodiments described in the disclosure and the configurations shown in the drawings are only examples of the disclosure, and various modifications may be made at the time of filing of the disclosure to replace the embodiments and drawings of the disclosure.

In the description of the drawings, like numbers refer to like elements throughout the description of the drawings.

The terms used herein are for the purpose of describing the embodiments and are not intended to restrict and/or to limit the disclosure. The singular expressions herein may include plural expressions, unless the context clearly dictates otherwise. In addition, the terms "comprises", "includes", and "has" are intended to indicate that there are features, numbers, steps, operations, elements, parts, or combinations thereof described in the disclosure, and do not exclude the presence or addition of one or more other features, numbers, steps, operations, elements, parts, or combinations thereof.

It will be understood that, although the terms first, second, etc. used in the disclosure may be used herein to describe various components, these components should not be limited by these terms. These terms are only used to distinguish one component from another. For example, a first element could be termed a second element, and similarly, a second element could be termed a first element without departing from the scope of the disclosure. The term "and/or" includes combinations of one or all of a plurality of associated listed items.

In addition, the meaning of "identical" or "same" in the disclosure may include having similar properties or similarity within a certain range. In addition, "identical" or "same" refers to "substantially identical". It should be understood that the meaning of "substantially identical" refers to a value that falls within an error range in manufacturing or a value having a difference within a range that does not have significance with respect to a reference value.

The terms, such as "~part", "~device", "~block", "~member", "~module", and the like may refer to a unit for processing at least one function or act. For example, the terms may refer to at least process processed by at least one hardware, such as a field-programmable gate array (FPGA) and/or application specific integrated circuit (ASIC), software stored in memories, or processors.

In the following description, the terms "front," "rear," "left," and "right," are defined based on the directions illustrated in the drawings, but the terms need not restrict the shape and position of the respective components.

In particular, an orientation guide (that is, a "compass") is provided in various drawings. This guide is intended to provide a consistent sense of direction between drawings, such that the orientation of related elements in different drawings relative to each other can be more easily determined. It is noted that the terms for the directions are selected for convenience, and are not limiting as to the orientation of the depicted elements relative to elements which are not part of the depicted system. As but one example, the presentation of an "upper" direction does not require that a depicted display be installed to orient the indicated side of the display upward relative to the ground; for example, if the display is installed in a portrait orientation rather than a depicted landscape orientation, the "upper" direction indicated in the figures would be horizontal relative to the ground. It is additionally noted that the use of, for example, "upper" to describe certain features herein does not necessarily indicate a correspondence to the "upper" direction of the guide, and likewise for similar adjectives, as will become clear.

Hereinafter, embodiment according to the disclosure will be described in detail with reference to the accompanying drawings.

FIG. 1 is a perspective view illustrating a display apparatus, according to an embodiment of the disclosure.

Referring to FIG. 1, a display apparatus 10 is a device that processes an image signal received from an outside and visually displays the processed image. Hereinafter, a case in which the display apparatus 10 is a television is exemplified, but the disclosure is not limited thereto. For example, the display apparatus 10 may be implemented in various forms, such as a monitor, a portable multimedia device, and a portable communication device, among other possibilities, and the display apparatus 10 is not limited in its shape as long as visually displaying an image.

As an example, the display apparatus 10 may be a large format display (LFD) installed outdoors, such as a roof of a building or a bus stop. "Outdoors" is not limited to the outside of a building, and thus the display apparatus 10 according to an embodiment may be installed in any places as long as the display apparatus may be accessed by a large number of people, even indoors, such as subway stations, shopping malls, movie theaters, companies, and stores. Also, the display apparatus 10 is not limited to the examples of an LFD or an "outdoors" installation, but may be of any size and any location of installation.

The display apparatus 10 may receive content including video signal and audio signal from various content sources and output video and audio corresponding to the video signal and the audio signal. For example, the display apparatus 10 may receive content data through a broadcast reception antenna or cable, receive content data from a content playback device, or receive content data from a content providing server of a content provider.

As shown in the embodiment illustrated in FIG. 1, the display apparatus 10 may include a body 11 and a screen 12 provided to display an image I.

The body 11 may form an appearance of the display apparatus 10, and the body 11 may include a component configured to allow the display apparatus 10 to display the image I and to perform various functions. Although the body 11 shown in the embodiment illustrated in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

The screen 12 may include a display panel for passing or blocking light emitted by a light source device or the like.

A plurality of pixels P may be formed on the screen 12 and the image I displayed on the screen 12 may be formed by a combination of the lights individually emitted from the plurality of pixels P. For example, the image I may be formed on the screen 12 by combining light emitted from the plurality of pixels P as a mosaic.

Each of the plurality of pixels P may emit light at different brightnesses and in different colors. In order to emit light in various colors, the plurality of pixels P may include sub-pixels PR, PG, and PB, respectively.

The sub-pixels PR, PG, and PB may include a red sub pixel PR emitting red light, a green sub pixel PG emitting green light, and a blue sub pixel PB emitting blue light. For example, the red light may represent a light beam having a wavelength of approximately 700 nm (nanometer, one billionth of a meter) to 800 nm. The green light may represent a light beam having a wavelength of approximately 500 nm to 600 nm. The blue light may represent a light beam having a wavelength of approximately 400 nm to 500 nm.

By combining the red light of the red sub pixel PR, the green light of the green sub pixel PG and the blue light of the blue sub pixel PB, each of the plurality of pixels P may emit light at different brightnesses and in different colors.

Figure 2:
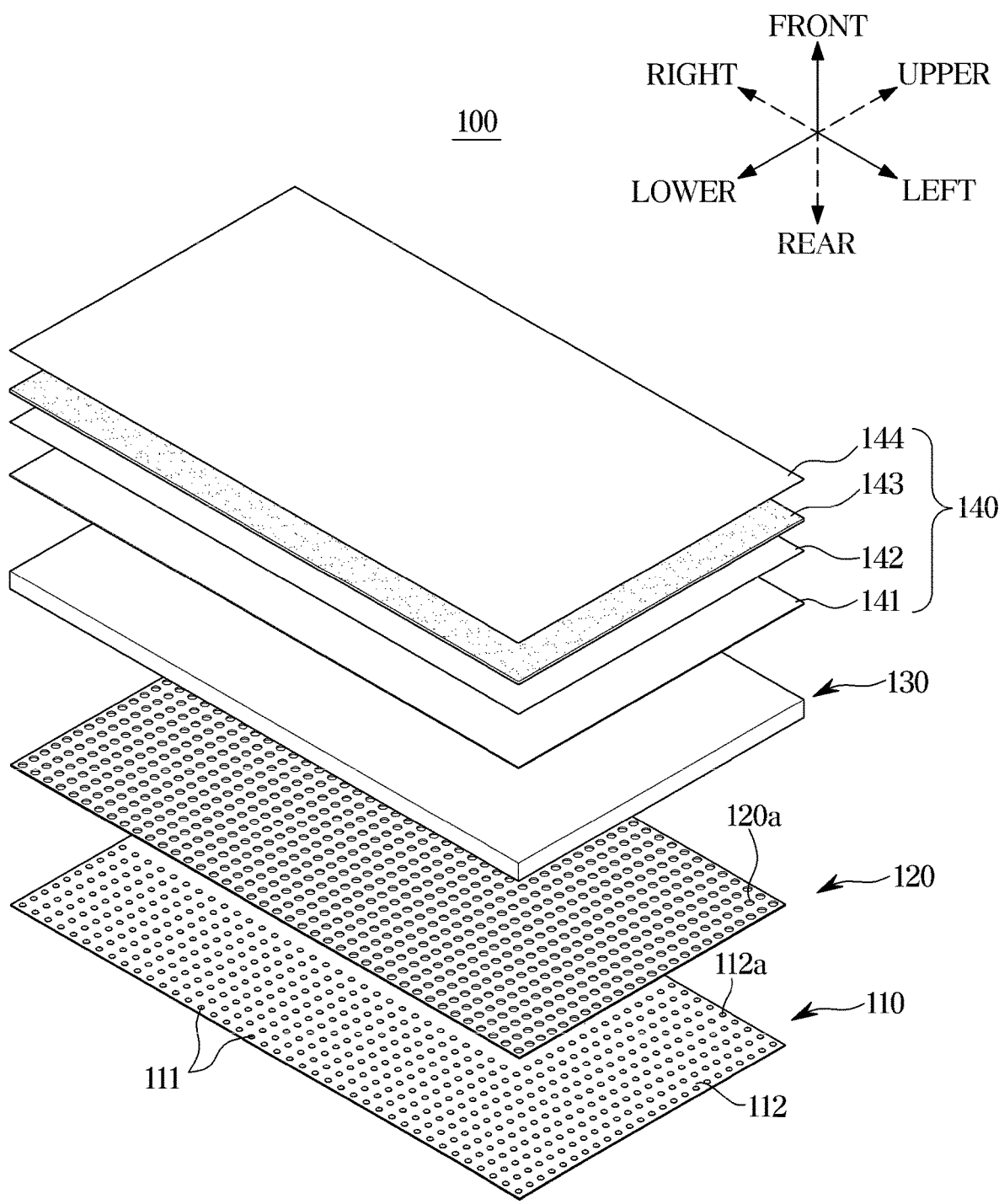
FIG. 2 is an exploded perspective view illustrating a display apparatus, according to an embodiment of the disclosure.
Figure 3:
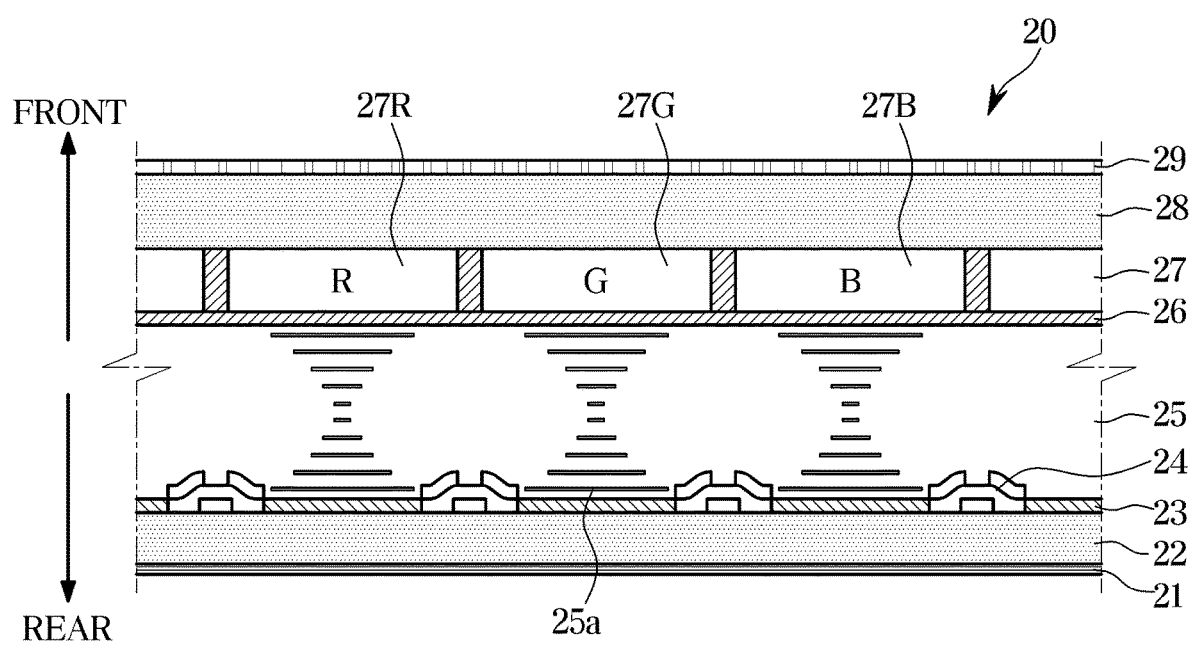
FIG. 3 is a cross-sectional view illustrating a liquid crystal panel included in a display apparatus, according to an embodiment of the disclosure.

FIG. 2 is an exploded perspective view illustrating a display apparatus, according to an embodiment of the disclosure. FIG. 3 is a cross-sectional view illustrating a liquid crystal panel included in a display apparatus, according to an embodiment of the disclosure.

As shown in the embodiments illustrated in FIGS. 2 and 3, various components configured to generate the image I on the screen 12 may be provided inside the display apparatus 10.

For example, the display apparatus 10 may include a light source device 100 that is a surface light source, a display panel 20 configured to block or transmit light emitted from the light source device 100, a control assembly 50 configured to control an operation of the light source device 100 and the display panel 20, and a power assembly 60 configured to supply power to the light source device 100 and the display panel 20. Further, the display apparatus 10 may include a bezel 13, a frame middle mold 14, a bottom chassis 15 and a rear cover 16 which are provided to support the display panel 20, the light source device 100, the control assembly 50 and the power assembly 60.

The light source device 100 may include a point light source configured to emit monochromatic light or white light. In addition, the light source device 100 may refract, reflect, and scatter light emitted from the point light source so as to convert the light emitted from the point light source to surface light. As mentioned above, the light source device 100 may refract, reflect, and scatter light emitted from the point light source, thereby emitting uniform surface light toward the front. The light source device 100 may be referred as a backlight unit 100.

The light source device 100 will be described in more detail below.

The display panel 20 may be provided in front of the light source device 100, and may block or transmit light emitted from the light source device 100 to form the image I.

A front surface of the display panel 20 may form the screen 12 of the display apparatus 10 described above with reference to FIG. 1, and the display panel 20 may form the plurality of pixels P. In the display panel 20, the plurality of pixels P may independently block or transmit light from the light source device 100. In addition, the light transmitted through the plurality of pixels P may form the image I displayed on the screen 12.

The display panel may be a liquid crystal panel. For example, as shown in the embodiment illustrated in FIG. 3, the display panel 20 may include a first polarizing film 21, a first transparent substrate 22, a pixel electrode 23, a thin film transistor (TFT) 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the TFT 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on the outside of the first and second transparent substrates 22 and 28. Each of the first polarizing film 21 and the second polarizing film 29 may transmit a specific polarization and block (reflect or absorb) other polarizations. For example, the first polarizing film 21 may transmit a polarization in a first direction and block (reflect or absorb) other polarizations. In addition, the second polarizing film 29 may transmit a polarization in a second direction and block (reflect or absorb) other polarizations. In this case, the first direction and the second direction may be perpendicular to each other. Therefore, the polarization passing through the first polarizing film 21 may be prevented from directly passing through the second polarizing film 29.

The color filter 27 may be provided on the inside of the second transparent substrate 28. The color filter 27 may include a red filter 27R transmitting red light, a green filter 27G transmitting green light, and a blue filter 27B transmitting blue light. In addition, the red filter 27R, the green filter 27G, and the blue filter 27B may be disposed parallel to each other. A region occupied by the color filter 27 corresponds to the pixel P described above. A region occupied by the red filter 27R corresponds to the red sub-pixel PR, a region occupied by the green filter 27G corresponds to the green sub-pixel PG, and a region occupied by the blue filter 27B corresponds to the blue sub-pixel PB.

The pixel electrode 23 may be provided on the inside of the first transparent substrate 22, and the common electrode 26 may be provided on the inside of the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules forming the liquid crystal layer 25.

The TFT 24 may be provided on the inside of the first transparent substrate 22. The TFT 24 may be turned on (closed) or turned off (open) according to image data provided from a panel driver 30. In addition, an electric field may be formed or removed between the pixel electrode 23 and the common electrode 26 in response to turning on (closing) or turning off (opening) the TFT 24.

The liquid crystal layer 25 may be formed between the pixel electrode 23 and the common electrode 26, and the liquid crystal layer 25 may be filled with liquid crystal molecules 25a. Liquid crystals may represent an intermediate state between a solid (crystal) and a liquid. Liquid crystals also exhibit optical properties according to changes in an electric field. For example, in the liquid crystal, the orientation of molecules forming the liquid crystal may change according to a change in an electric field. As a result, the optical properties of the liquid crystal layer 25 may vary depending on the presence or absence of the electric field passing through the liquid crystal layer 25. For example, the liquid crystal layer 25 may rotate the polarization direction of light with respect to the optical axis depending on whether an electric field is present or absent. As a result, the polarization passed through the first polarizing film 21 may be rotated in the polarization direction while passing through the liquid crystal layer 25, and thus may pass through the second polarizing film 29.

Returning to FIG. 2, a cable 20a configured to transmit image data to the display panel 20, and a display driver integrated circuit (DDI) (hereinafter referred to as "panel driver") 30 configured to process digital image data and output an analog image signal may be provided at one side of the display panel 20.

The cable 20a may electrically connect the control assembly 50 and/or the power assembly 60 to the panel driver 30, and may also electrically connect the panel driver 30 to the display panel 20. The cable 20a may include a flexible flat cable or a film cable that is bendable.

The panel driver 30 may receive image data and power from the control assembly 50 and/or the power assembly 60 through the cable 20a. In addition, the panel driver 30 may transmit the image data and driving current to the display panel 20 through the cable 20a.

In addition, the cable 20a and the panel driver 30 may be integrally implemented as a film cable, a chip on film (COF), or a tape carrier package (TCP). In other words, the panel driver 30 may be disposed on the cable 20a. However, the disclosure is not limited thereto, and the panel driver 30 may be disposed on the display panel 20.

The control assembly 50 may include a control circuit configured to control an operation of the display panel 20 and the light source device 100. For example, the control circuit may process video signals and/or audio signals received from an external content source. The control circuit may transmit the image data to the display panel 20, and transmit dimming data to the light source device 100.

The power assembly 60 may include a power supply circuit that supplies power to the display panel 20 and the light source device 100. The power supply circuit may supply power to the control assembly 50, the light source device 100, and the display panel 20.

The control assembly 50 and the power assembly 60 may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

Figure 4:
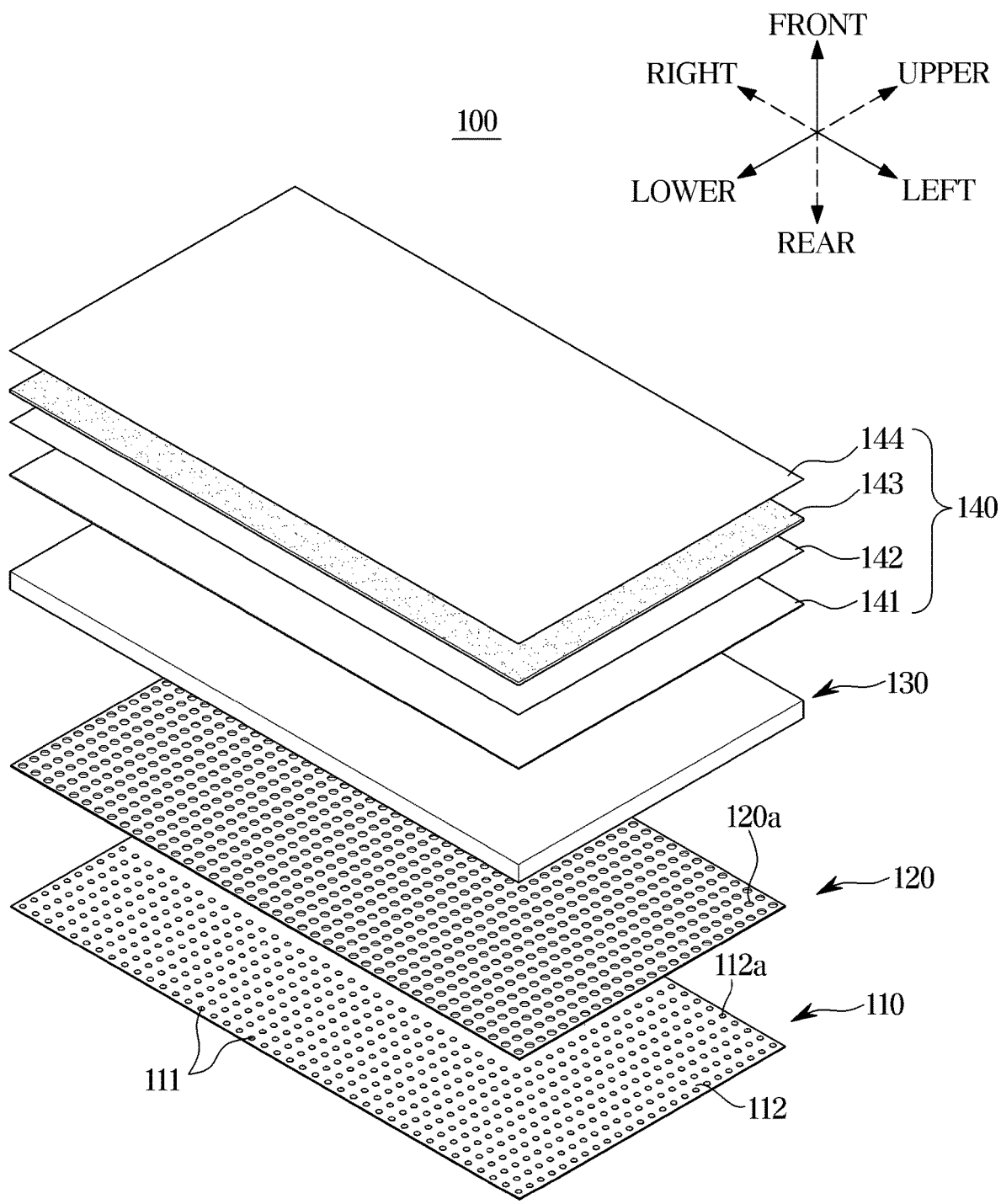
FIG. 4 is an exploded perspective view illustrating a light source device included in a display apparatus, according to an embodiment of the disclosure.

Hereinafter, the light source device 100 will be described.
FIG. 4 is an exploded perspective view illustrating a light source device included in a display apparatus, according to an embodiment of the disclosure.

Referring to FIG. 4, the light source device 100 includes a light source module 110 configured to generate light, a reflective sheet 120 configured to reflect light, a diffuser plate 130 configured to uniformly diffuse light, and an optical sheet 140 configured to improve a luminance of light that is emitted.

The light source module 110 may include a plurality of light sources 111 configured to emit light, and a light source substrate 112 provided to support and/or fix the plurality of light sources 111. The light source substrate 112 may be referred to as a substrate 112.

The plurality of light sources 111 may be disposed in a predetermined pattern to allow light to be emitted with uniform luminance. The plurality of light sources 111 may be disposed in such a way that a distance between one light source and light sources adjacent thereto is the same, or substantially the same.

The light source 111 may employ an element configured to emit monochromatic light (light of a specific wavelength, for example, blue light) or white light (for example, light of a mixture of red light, green light, and blue light) in various directions by receiving power. For example, the light source 111 may include LEDs.

The substrate 112 may fix the plurality of light sources 111 to prevent a change in the position of the light source 111. Further, the substrate 112 may supply power, which is for the light source 111 to emit light, to the light source 111.

The substrate 112 may include a conductive power supply line formed thereon to fix the plurality of light sources 111 and supply power to the light source 111. The substrate 112 may include an insulation layer formed of a synthetic resin and/or tempered glass. A circuit may be printed on one surface of the substrate 112. For example, a circuit may be formed on a front surface 112a of the substrate 112 facing the display panel 20.

The reflective sheet 120 may be disposed on the front surface 112a of the substrate 112 facing the display panel 20. The reflective sheet 120 may reflect light emitted from the plurality of light sources 111 to a front side or to a direction close to the front side.

In the reflective sheet 120, a plurality of through holes 120a may be formed at positions corresponding to each of the plurality of light sources 111 of the light source module 110. In addition, the light source 111 of the light source module 110 may pass through the through hole 120a and protrude to the front of the reflective sheet 120.

For example, in a process of assembling the reflective sheet 120 and the light source module 110, the plurality of light sources 111 of the light source module 110 may be inserted into the plurality of through holes 120a formed in the reflective sheet 120. Accordingly, the substrate 112 of the light source module 110 may be located behind the reflective sheet 120, but the plurality of light sources 111 of the light source module 110 may be located in front of the reflective sheet 120. The plurality of light sources 111 may emit light from the front of the reflective sheet 120.

The plurality of light sources 111 may emit light in various directions from the front of the reflective sheet 120. The light may be emitted toward the diffuser plate 130 from the light sources 111 as well as toward the reflective sheet 120 from the light sources 111, and the reflective sheet 120 may reflect the light emitted toward the reflective sheet 120 toward the diffuser plate 130.

The light emitted from the light sources 111 passes through various objects such as the diffuser plate 130, the optical sheet 140, and the like. When the light passes through the diffuser plate 130 and the optical sheet 140, some of the incident light may be reflected from the surfaces of the diffuser plate 130 and the optical sheet 140. The reflective sheet 120 may reflect the light reflected by the diffuser plate 130 and the optical sheet 140.

The diffuser plate 130 may be provided in front of the light source module 110 and the reflective sheet 120, and may evenly distribute the light emitted from the light source 111 of the light source module 110.

The diffuser plate 130 may allow light emitted from the plurality of light sources 111 to be diffused inside the diffuser plate 130 to remove unevenness in luminance caused by the plurality of light sources 111. In other words, the diffuser plate 130 may uniformly emit uneven light of the plurality of light sources 111 to the front surface.

The optical sheet 140 may include various sheets for improving luminance and luminance uniformity. For example, the optical sheet 140 may include a diffusion sheet 141, a first prism sheet 142, a second prism sheet 143, and a reflective polarization sheet 144.

The diffusion sheet 141 may diffuse light for uniformity of luminance. Light emitted from the light source 111 may be diffused by the diffuser plate 130 and diffused again by the diffusion sheet 141 included in the optical sheet 140.

The first and second prism sheets 142 and 143 may increase luminance by focusing the light diffused by the diffusion sheet 141. The first and second prism sheets 142 and 143 may include a prism pattern having a triangular prism shape, and a plurality of the prism patterns may be arranged to be adjacent to each other to form a plurality of band shapes.

The reflective polarization sheet 144 may be a type of polarization film, and may transmit a portion of the incident light and reflect another portion of the light to improve luminance. For example, light polarized in the same or substantially same direction as a predetermined polarization direction of the reflective polarization sheet 144 may be transmitted, and light polarized in a direction different from the polarization direction of the reflective polarization sheet 144 may be reflected. Further, the light reflected by the reflective polarization sheet 144 may be recycled in the light source device 100, and such light recycling may allow the luminance of the display apparatus 10 to be improved.

The sheet of film included in the optical sheet 140 is not limited to the sheet or film shown in FIG. 4, and the optical sheet 140 may include more various sheets, such as a protective sheet, or films.

Figure 5:
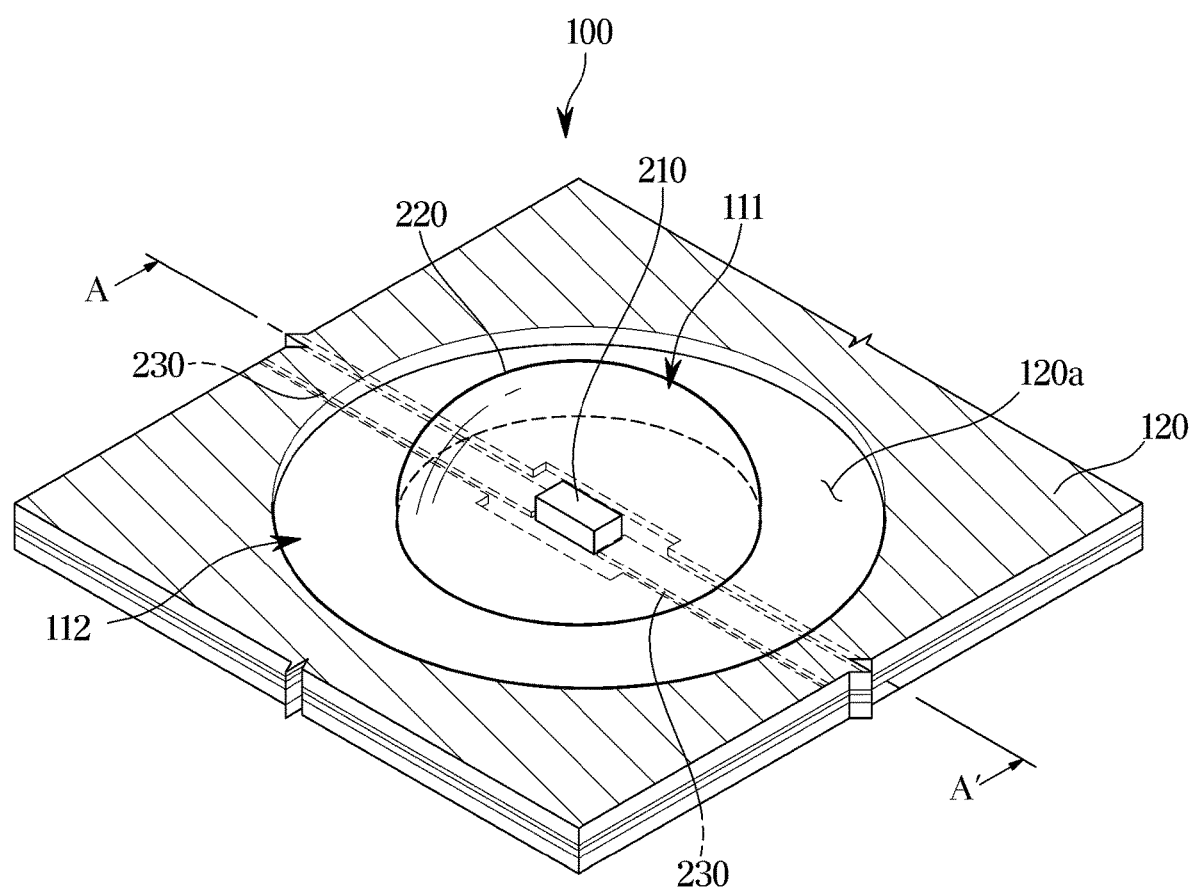
FIG. 5 is a perspective view illustrating a light source included in a light source device, according to an embodiment of the disclosure.
Figure 6:
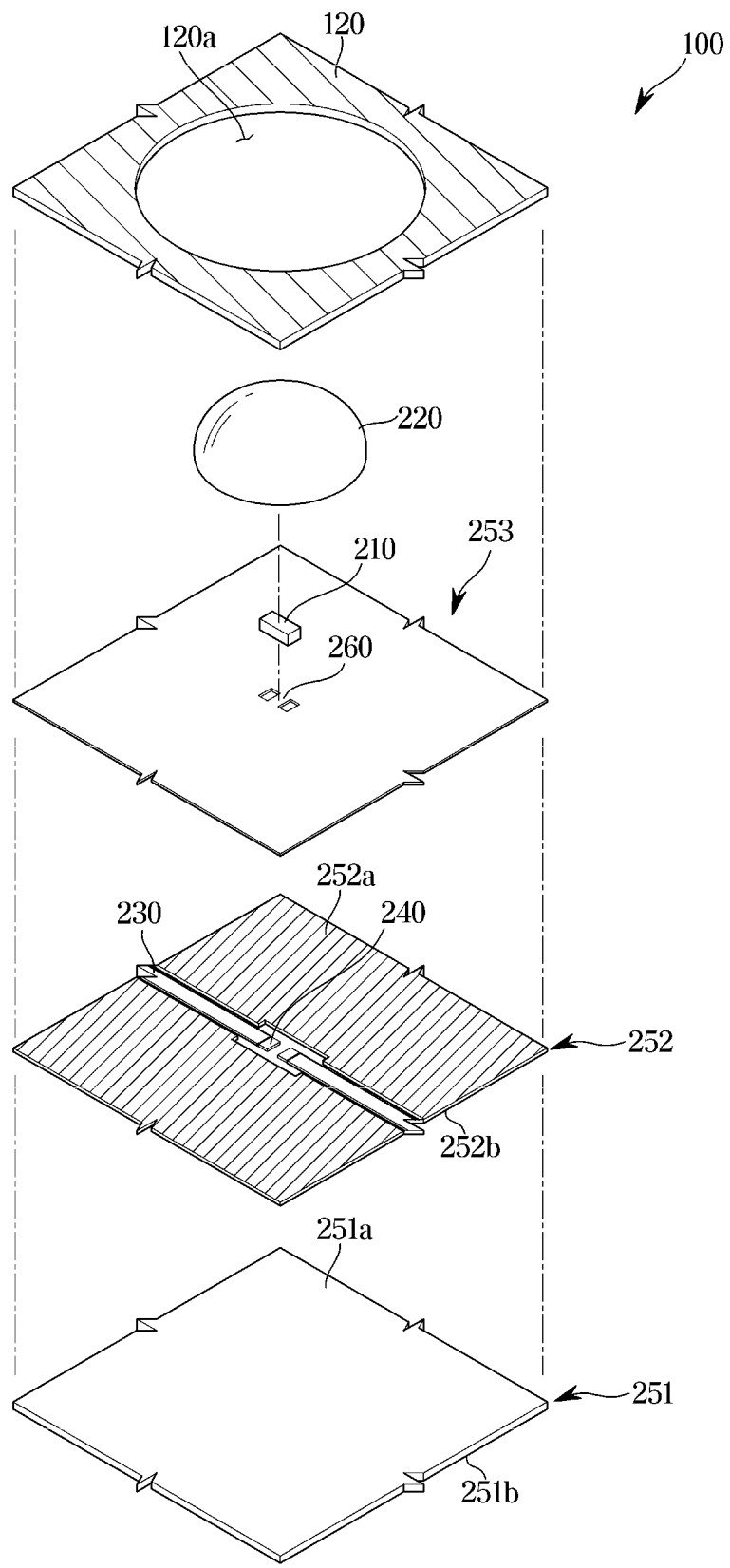
FIG. 6 is an exploded perspective view illustrating the light source shown in FIG. 5.
Figure 7:
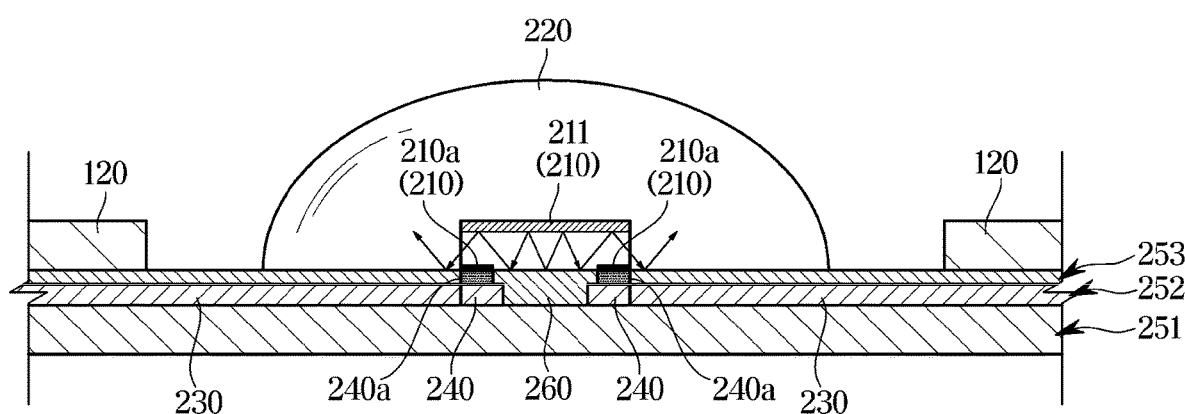
FIG. 7 is a side cross-sectional view taken along line A-A' of the light source shown in FIG. 5.

FIG. 5 is a perspective view illustrating a light source included in a light source device, according to an embodiment of the disclosure. FIG. 6 is an exploded perspective view illustrating the light source shown in FIG. 5. FIG. 7 is a side cross-sectional view taken along line A-A' of the light source shown in FIG. 5, in which an optical path of the light source is illustrated.

Referring to FIGS. 5 to 7, the light source module 110 includes the plurality of light sources 111. The plurality of light sources 111 may pass through the through holes 120a from behind the reflective sheet 120 to protrude to the front of the reflective sheet 120. Accordingly, the light source 111 and a portion of the substrate 112 may be exposed toward the front of the reflective sheet 120 through the through hole 120a.

The light source 111 may include an electrical/mechanical structure located in a region defined by the through hole 120a of the reflective sheet 120. For example, each of the plurality of light sources 111 may include a LED 210 and an optical dome 220.

In order to improve the uniformity of surface light emitted by the light source device 100 and the contrast ratio by local dimming, the number of light sources 111 may be increased.

The LED 210 may include a P-type semiconductor and an N-type semiconductor for emitting light by recombination of holes and electrons. In addition, the LED 210 may be provided with a pair of electrodes 210a for supplying holes and electrons to a P-type semiconductor and a N-type semiconductor, respectively.

The LED 210 may convert electrical energy to optical energy. In other words, the LED 210 may emit light having the maximum intensity at a predetermined wavelength at which power is supplied. For example, the LED 210 may emit blue light having a peak value at a wavelength which represents a blue color (for example, a wavelength between 450 nm to 495 nm).

The LED 210 may be directly attached to the substrate 112 in a chip on board (COB) manner. In other words, the light source 111 may include the LED 210 in which a LED chip or a LED die is directly attached to the substrate 112 without separate packaging.

In order to reduce an area to be occupied by the LED 210, the LED 210 may be manufactured in a flip chip type in which a zero diode is not included. As for the flip-chip type LED 210, when bonding a LED corresponding to a semiconductor element to the substrate 112, an electrode pattern of the semiconductor element may be fused to the substrate 112 as it is, without using intermediate media, such as a metal lead (wire) or ball grid array (BGA).

Accordingly, in embodiments where the metal lead (wire) or the ball grid array is omitted, the light source 111 including the flip-chip type LED 210 may be provided in a miniature structure.

In order to miniaturize the light source 111, the light source module 110 may be manufactured such that a flip-chip type LED 210 is attached to the substrate 112 in a chip on board manner.

In the above description, a flip chip type LED 210 directly fused to the substrate 112 in a chip on board method has been described, but the light source 111 is not limited to the flip chip type LED. For example, the light source 111 may include a package type light emitting diode (LED).

On the substrate 112, a feeding line 230 and a feeding pad 240 to supply power to the LED 210 may be provided.

On the substrate 112, the feeding line 230 may be provided on the substrate 112 to supply electrical signals and/or power from the control assembly 50 and/or the power assembly 60 to the LED 210.

As shown in the embodiment illustrated in FIG. 7, the substrate 112 may be formed by alternately stacking a non-conductive insulation layer 251 and a conductive conduction layer 252.

The insulation layer 251 may include a first surface 251a and a second surface 251b, and the conduction layer 252 may also include a first surface 252a and a second surface 252b. The conduction layer 252 may be deposited on the first surface 251a of the insulation layer 251.

A line or pattern through which power and/or an electrical signal passes may be formed in the conduction layer 252. The conduction layer 252 may be formed of various materials having electrical conductivity. For example, the conduction layer 252 may be formed of various metal materials, such as copper (Cu), tin (Sn), aluminum (Al), an alloy thereof, and the like. The conduction layer 252 may be stacked on one surface of the insulation layer 251, such as the first surface 251a.

A dielectric of the insulation layer 251 may insulate between the lines or patterns of the conduction layer 252. The insulation layer 251 may be formed of a dielectric for electrical insulation, for example, FR-4.

The feeding line 230 may be implemented by the line or pattern formed on the conduction layer 252. The feeding line 230 may be electrically connected to the LED 210 through a feeding pad 240. The feeding pad 240 may be formed by exposing the feeding line 230 to the outside.

A protective layer 253 configured to prevent or suppress damage due to an external impact, damage due to a chemical action (for example, corrosion or the like) and/or damage due to an optical action may be formed on the outermost side on the substrate 112. The protective layer 253 may include a photo solder resist (PSR).

As shown in the embodiment illustrated in FIG. 7, the protective layer 253 may cover the feeding line 230 to prevent the feeding line 230 from being exposed to the outside.

The protective layer 253 may have a window that exposes a portion of the feeding line 230 to the outside for electrical contact between the feeding line 230 and the LED 210. The portion of the feeding line 230 exposed to the outside by the window of the protective layer 253 may form the feeding pad 240.

The feeding pad 240 may be coated with a conductive adhesive material 240a for electrical contact between the feeding line 230 exposed to the outside and the electrodes 210a of the LED 210. The conductive adhesive material 240a may be applied to the inside of the window of the protective layer 253.

The electrodes 210a of the LED 210 may come into contact with the conductive adhesive material 240a, and the LED 210 may be electrically connected to the feeding line 230 through the conductive adhesive material 240a.

The conductive adhesive material 240a may include, for example, solder having electrical conductivity. However, the disclosure is not limited thereto, and the conductive adhesive material 240a may instead or additionally include, for example, electrically conductive epoxy adhesives.

Power may be supplied to the LED 210 through the feeding line 230 and the feeding pad 240, and when the power is supplied, the LED 210 may emit light. A pair of feeding pads 240 respectively corresponding to the pair of electrodes 210a provided in the flip-chip type LED 210 may be provided.

The optical dome 220 may cover the LED 210. The optical dome 220 may prevent or suppress damages to the LED 210 caused by an external mechanical action and/or damage to the LED 210 caused by a chemical action.

The optical dome 220 may have a dome shape formed in such a way that a sphere is cut into a surface not including the center thereof, or may have a hemispherical shape in such a way that a sphere is cut into a surface including the center thereof. A vertical cross section of the optical dome 220 may be an arc shape or a semicircle shape.

The optical dome 220 may be formed of silicone or epoxy resin. For example, the molten silicon or epoxy resin may be discharged onto the LED 210 through a nozzle, and the discharged silicon or epoxy resin may be cured, thereby forming the optical dome 220.

Accordingly, the shape of the optical dome 220 may vary depending on the viscosity of the liquid silicone or epoxy resin. For example, in embodiments where the optical dome 220 is manufactured using silicon having a thixotropic index of about 2.7 to 3.3 (appropriately, 3.0), the optical dome 220 may have a dome ratio, indicating a ratio of a height of a dome to a diameter of a base of the dome (the height of the dome/a diameter of the base), of approximately 2.5 to 3.1 (appropriately 2.8). For example, the optical dome 220 formed of silicon having a thixotropic index of about 2.7 to 3.3 (appropriately 3.0) may have a diameter of a base of about 2.5 mm and a height of about 0.7 mm.

The optical dome 220 may be optically transparent or translucent. Light emitted from the LED 210 may be emitted to the outside by passing through the optical dome 220.

In this case, the dome-shaped optical dome 220 may refract light like a lens. For example, light emitted from the LED 210 may be refracted by the optical dome 220 and thus may be dispersed.

As described above, the optical dome 220 may protect the LED 210 from an external mechanical action, chemical action, or electrical action, as well as dispersing light emitted from the LED 210.

An antistatic member (not shown) may be formed adjacent to the optical dome 220 to protect the LED 210 from electrostatic discharge. The antistatic member (not shown) may absorb an electric shock caused by electrostatic discharge generated in the vicinity of the optical dome 220.

Referring to FIG. 7, the light source module 110 may include an insulation layer 251 having a non-conductive property, a conduction layer 252 having a conductive property and stacked on the front surface of the insulation layer 251 and including a feeding line 230, and a protective layer 253 having a non-conductive property and stacked on the front surface of the conduction layer 252. The insulation layer 251 may be referred to as a first layer, the conduction layer 252 as a second layer, and the protective layer 253 as a third layer.

The LED 210 may be disposed on the protective layer 253. More specifically, the LED 210 may be disposed on the front surface 112a of the substrate 112 to cover a window formed in the protective layer 253.

The pair of feeding pads 240 may be formed in the conduction layer 252 and connected to the feeding line 230. The pair of feeding pads 240 may be electrically connected to the LED 210 through the window formed in the protective layer 253. The pair of feeding pads 240 may be disposed to be separated from each other.

The light source module 110 may include a reflective auxiliary layer 260.

In the embodiment illustrated in FIG. 7, the reflective auxiliary layer 260 is formed between the pair of feeding pads 240 together with the protective layer 253. Accordingly, the defect rate due to the size asymmetry of the pair of feeding pads 240 may be reduced.

The LED 210 may include a distributed Bragg reflector (DBR) layer 211.

The DBR layer 211 may be a multilayer reflector including two materials having different refractive indices. Fresnel reflection occurs at the interfaces of the DBR layer 211 due to the difference in refractive index of each material. Accordingly, light incident onto the DBR layer may be reflected at a wide range of angle, and the light directivity angle of the LED 210 may be provided at about 165 degrees or more.

Light emitted from the LED 210 may be reflected by the DBR layer 211 and then reflected again by the reflective auxiliary layer 260. With such a configuration, optical loss of light traveling to a space between the pair of feeding pads 240 may be prevented.

Specifically, in embodiments where the reflective auxiliary layer 260 is formed of a material having a higher reflectance than the insulation layer 251, the reflective auxiliary layer 260 covering the front of the insulation layer 251 may minimize optical loss that occurs when light is directed to the rear side of the LED 210 and absorbed by the insulation layer 251.

Figure 8:
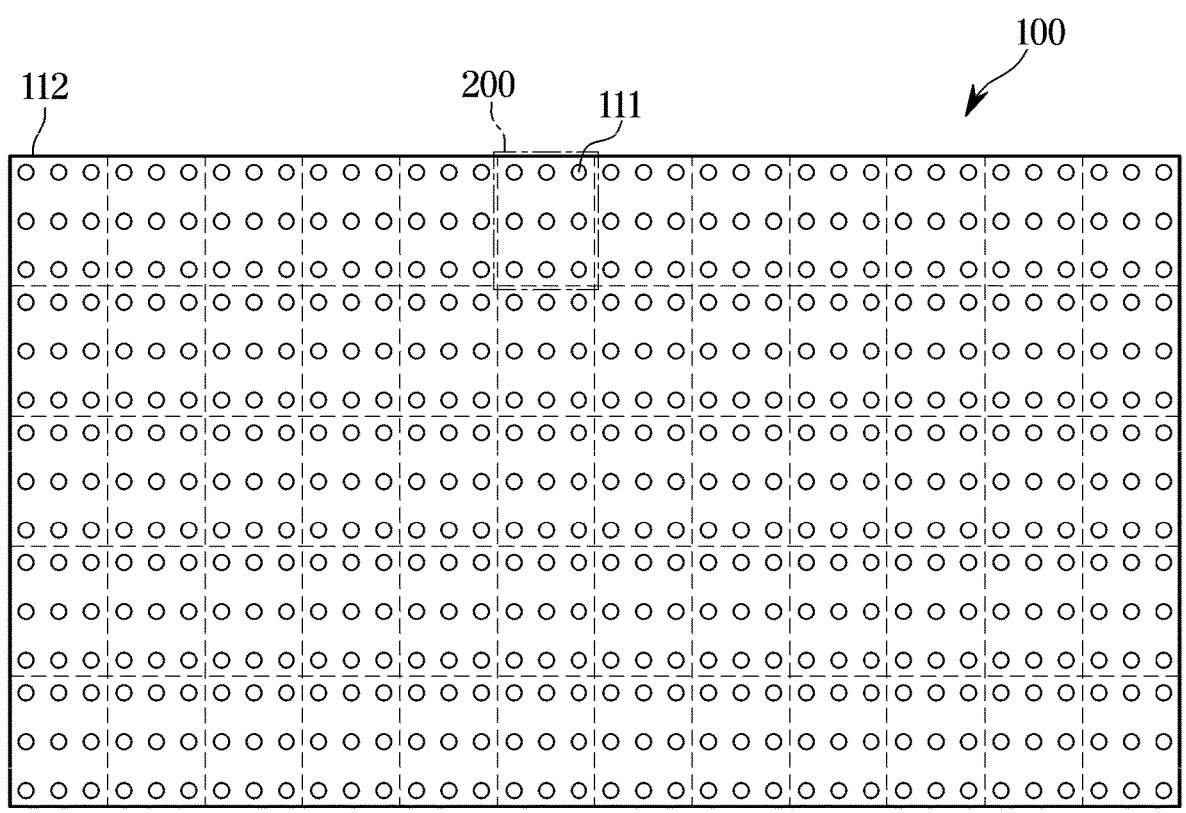
FIG. 8 is a view illustrating a plurality of light sources of a display apparatus that are divided into a plurality of dimming blocks, according to an embodiment of the disclosure.
Figure 9:
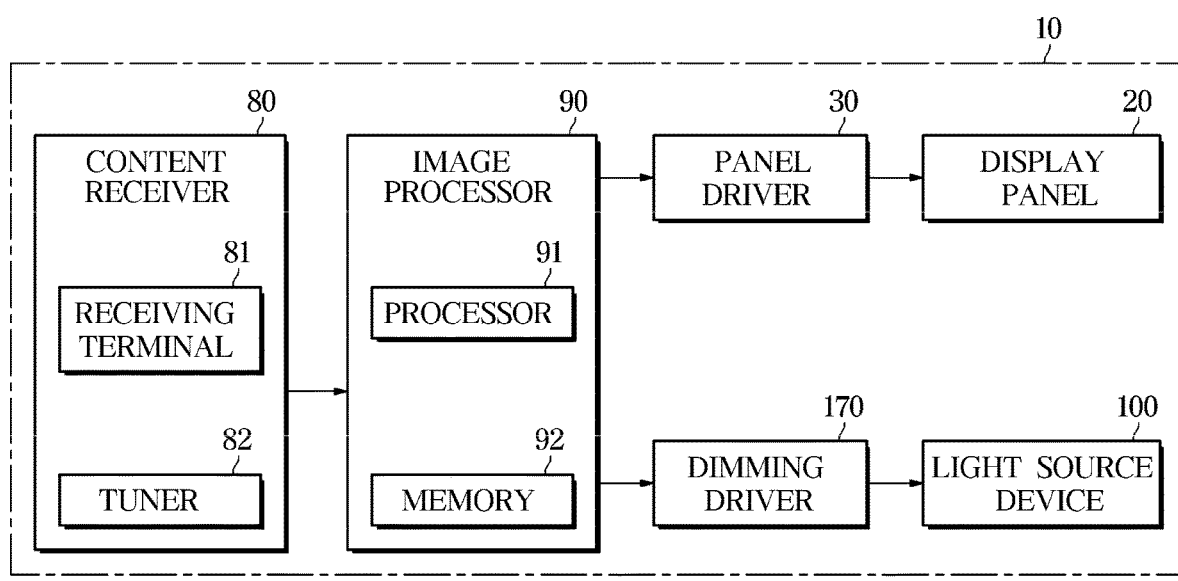
FIG. 9 is a control block diagram of a display apparatus, according to an embodiment of the disclosure.

FIG. 8 is a view illustrating a plurality of light sources of a display apparatus that are divided into a plurality of dimming blocks, according to an embodiment of the disclosure. FIG. 9 is a control block diagram of a display apparatus, according to an embodiment of the disclosure.

The display apparatus 10 may perform local dimming to vary the brightness of light for each region of the light source device 100 in association with an output image to improve power consumption while increasing the contrast ratio.

For example, the display apparatus 10 may decrease the brightness of the light source 111 of the light source device 100 corresponding to a dark portion of the image to make the dark portion of the image darker, and increase the brightness of the light source 111 of the light source device 100 corresponding to a bright portion of the image to make the bright portion of the image brighter. Accordingly, the contrast ratio of an image may be improved.

The display apparatus 10 divides the light source device 100 into a plurality of blocks, and independently controls current for each block according to an input image. Image transmission of the display apparatus 10 proceeds in a method through local dimming driving for each frame, and driving of current may be adjusted according to the number of divided blocks of light sources 111 in the light source device 100.

As a result, the display apparatus 10 may effectively improve the contrast ratio by lowering the supply current to a dimming block corresponding to a dark area of the input image and increasing the supply current to a dimming block corresponding to a bright area of the input image.

For local dimming, the plurality of light sources 111 included in the light source device 100 may be divided into a plurality of dimming blocks 200. For example, as shown in the embodiment illustrated in FIG. 8, a total of sixty dimming blocks 200 may be provided as five rows and twelve columns. However, the number of dimming blocks 200 is not limited to the above example.

Referring to FIG. 8, each of the plurality of dimming blocks 200 may include at least one light source 111. The light source device 100 may supply the same driving current to the light sources 111 belonging to the same dimming block 200, and the light sources 111 belonging to the same dimming block 200 may emit light of the same or substantially same brightness.

In addition, the light source device 100 may supply different driving currents to the light sources 111 belonging to different dimming blocks 200 according to dimming data, and the light sources 111 belonging to different dimming blocks 200 may emit light having different brightness.

Each of the plurality of dimming blocks 200 may include, for example, N×M light sources arranged in an N×M matrix form (N and M are natural numbers). The N×M matrix refers to a matrix with N rows and M columns.

In embodiments where each light source 111 includes a LED, each of the plurality of dimming blocks 200 may include N×M LEDs.

The plurality of dimming blocks 200 may be disposed on the substrate 112. That is, N×M×B LEDs may be disposed on the substrate 112, where B is the number of the plurality of dimming blocks 200 (B is a natural number).

As shown in the embodiment illustrated in FIG. 9, the display apparatus 10 may include a content receiver 80, an image processor 90, a panel driver 30, a display panel 20, a dimming driver 170 and the light source device 100.

The content receiver 80 may include a receiving terminal 81 provided to receive a content including a video signal and/or an audio signal from content sources, and a tuner 82.

The receiving terminal 81 may receive a video signal and an audio signal from content sources through a cable.

The tuner 82 may receive a broadcast signal from a broadcast reception antenna or a wired cable. In addition, the tuner 82 may extract a broadcast signal of a channel selected by a user from among the broadcast signals.

The content receiver 80 may receive a video signal and an audio signal from the content sources through the receiving terminal 81 and/or the tuner 82. The content receiver 80, may output the video signal and/or audio signal received through the receiving terminal 81 and/or the tuner 82 to the image processor 90.

The image processor 90 includes a processor 91 configured to process image data, and a memory 92 configured to memorize/store programs and data for processing image data.

The memory 92 may be a non-transitory computer-readable memory. The memory 92 may store programs and data for processing a video signal and/or an audio signal. The memory 92 may temporarily memorize or store data generated in processing of a video signal and/or an audio signal.

The processor 91 may receive a video signal and/or an audio signal from the content receiver 80. The processor 91 may decode the video signal into image data. The processor 91 may generate dimming data from image data. In addition, the processor 91 may output image data and dimming data to the panel driver 30 and the dimming driver 170, respectively.

The image processor 90 may generate image data and dimming data from the video signal acquired by the content receiver 80. In addition, the image processor 90 may transmit the image data and the dimming data to the display panel 20 and the light source device 100, respectively.

The image data may include information about intensity of light transmitted by each of the plurality of pixels (or the plurality of sub-pixels) included in the display panel 20. The image data may be provided to the display panel 20 through the panel driver 30.

The panel driver 30 may receive image data from the image processor 90. The panel driver 30 may drive the display panel 20 according to the image data. In other words, the panel driver 30 may convert image data that is a digital signal (hereinafter referred to as "digital image data") to an analog image signal that is an analog voltage signal. The panel driver 30 may provide the analog image signal to the display panel 20. Optical properties (for example, light transmittance) of the plurality of pixels included in the display panel 20 may vary according to the analog image signal.

The panel driver 30 may include a timing controller, a data driver, and a scan driver.

The timing controller may receive image data from the image processor 90. The timing controller may output the image data and a driving control signal to the data driver and the scan driver. The driving control signal may include a scan control signal and a data control signal. The scan control signal and the data control signal may be used to control the operation of the scan driver and the operation of the data driver, respectively.

The scan driver may receive a scan control signal from the timing controller. The scan driver may, in response to the scan control signal, input-activate any one row among a plurality of rows in the display panel 20. In other words, the scan driver may convert pixels, which are included in one row among a plurality of pixels arranged in the plurality of rows and the plurality of columns, into a state capable of receiving an analog image signal. In this case, pixels other than the pixels which are input-activated by the scan driver might not receive an analog image signal.

The data driver may receive the image data and a data control signal from the timing controller. The data driver may, in response to the data control signal, output the image data to the display panel 20. For example, the data driver may receive digital image data from the timing controller. The data driver may convert digital image data into an analog image signal. In addition, the data driver may provide an analog image signal to pixels included in one row which is input-activated by the scan driver. In this case, the pixels which are input-activated by the scan driver may receive the analog image signal. Optical properties (for example, light transmittance) of the input-activated pixels may be changed according to the received analog image signal.

The panel driver 30 may drive the display panel 20 according to image data. Accordingly, an image corresponding to the image data may be displayed on the display panel 20.

In addition, the dimming data may include information about the intensity of light emitted from each of the plurality of light sources (or the plurality of dimming blocks) included in the light source device 100. Dimming data may be provided to the light source device 100 through the dimming driver 170.

The light source device 100 may include a plurality of light sources 111 emitting light. The plurality of light sources 111 may be arranged in a matrix form. In other words, the plurality of light sources 111 may be arranged in a plurality of rows and a plurality of columns.

The light source device 100 may be divided into a plurality of dimming blocks 200. In addition, each of the plurality of dimming blocks 200 may include at least one light source.

The light source device 100 may diffuse light emitted from the plurality of light sources 111, thereby outputting surface light. The display panel 20 may include a plurality of pixels, and may control the plurality of pixels to allow the plurality of pixels to individually transmit or block light. An image may be formed by light that passes through each of the plurality of pixels.

In this case, in order to make a dark part of an image darker, the light source device 100 may turn off the light sources corresponding to the dark part of the image. Accordingly, the dark part of the image may be made darker, and a contrast ratio of the image may be improved.

As such, an operation of the light source device 100 controlling a plurality of light sources to emit light in a region corresponding to a bright part of the image and controlling a plurality of light sources not to emit light in a region corresponding to a dark part of the image is hereinafter referred to as "local dimming".

For the local dimming, the plurality of light sources 111 included in the light source device 100 may be divided into a plurality of dimming blocks 200, as shown in the embodiment illustrated in FIG. 8. FIG. 8 illustrates a total of sixty dimming blocks with five rows and twelve columns, but the number and arrangement of dimming blocks are not limited to those shown in FIG. 8.

Each of the plurality of dimming blocks 200 may include at least one light source 111. The light source device 100 may supply the same driving current to light sources included in the same dimming block, and the light sources included in the same dimming block may emit light of the same or substantially same brightness. For example, light sources belonging to the same dimming block may be connected in series, and thus the same driving current may be supplied to the light sources belonging to the same dimming block.

In addition, the light source device 100 may further include a plurality of driving elements 300 (depicted later herein in FIGS. 10 and 11) that control driving currents supplied to the light sources included in each of the plurality of dimming blocks 200. Each of the driving elements 300 may be provided to correspond to at least one dimming block 200. In other words, the driving elements 300 may individually drive the dimming blocks 200.

As such, in embodiments where light sources belonging to a dimming block are connected in series with each other, the light sources included in the dimming block operate as one part and form a light source block as one party.

Therefore, hereinafter, "supplying a driving current to a dimming block" may be understood as "supplying a driving current to light sources included in the dimming block".

Although dimming blocks each including nine light sources are shown in FIG. 8, the number and arrangement of light sources included in each dimming block are not limited to those shown in FIG. 8.

As described above, the image processor 90 may provide dimming data for the local dimming to the light source device 100. The dimming data may include information about a luminance of each of the plurality of dimming blocks 200. For example, the dimming data may include information about intensity of light outputted by light sources included in each of the plurality of dimming blocks 200.

The image processor 90 may obtain dimming data from image data decoded from a video signal.

The image processor 90 may convert image data into dimming data in various ways. For example, the image processor 90 may divide an image I, based on the image data, into a plurality of image blocks. The number of the plurality of image blocks may be the same as the number of the plurality of dimming blocks 200, and each of the plurality of image blocks may correspond to each of the plurality of dimming blocks 200.

The image processor 90 may obtain luminance values of the plurality of dimming blocks 200 from the image data of the plurality of image blocks. In addition, the image processor 90 may generate dimming data by combining the luminance values of the plurality of dimming blocks 200.

For example, the image processor 90 may obtain a luminance value of each of the plurality of dimming blocks 200 based on a maximum value among luminance values of pixels included in each of the image blocks.

Each image block may include a plurality of pixels, and image data of the image block may include image data (for example, red data, green data, blue data, etc.) of the plurality of pixels. The image processor 90 may calculate a luminance value of each of the pixels based on the image data of each of the pixels.

The image processor 90 may determine a maximum value, among luminance values of pixels included in an image block, as a luminance value of a dimming block corresponding to the image block. For example, the image processor 90 may determine a maximum value, among luminance values of pixels included in an $i^{th}$ image block, as a luminance value of an $i^{th}$ dimming block, and determine a maximum value, among luminance values of pixels included in a $j^{th}$ image block, as a luminance value of a $j^{th}$ dimming block.

The image processor 90 may generate dimming data by combining luminance values of the plurality of dimming blocks 200.

The dimming driver 170 may receive dimming data from the image processor 90. The dimming driver 170 may drive the light source device 100 according to the dimming data. The dimming data may include information about a luminance of each of the plurality of dimming blocks 200 or information about brightness of the light sources included in the plurality of dimming blocks 200.

The dimming driver 170 may convert dimming data, which is a digital signal, into an analog driving current.

The dimming driver 170 may sequentially provide an analog dimming signal to the driving elements 300 respectively corresponding to the dimming blocks 200, for example, in an active matrix manner.

The dimming driver 170 may include a connector (not shown). The dimming driver 170 may transmit a scan signal, a data signal, and a power signal to the driving element 300 through the connector.

The plurality of dimming blocks 200 may be divided into a plurality of groups. Dimming blocks belonging to the same group may be simultaneously supplied with driving currents, and dimming blocks belonging to different groups may be sequentially supplied with driving currents at different times. The dimming driver 170 may activate dimming blocks belonging to one of a plurality of groups and provide an analog dimming signal to the activated dimming blocks. Then, the dimming driver 170 may activate dimming blocks belonging to another group and provide an analog dimming signal to the activated dimming blocks.

For example, dimming blocks located in the same row may belong to the same group, and dimming blocks located in different rows may belong to different groups, but the method of dividing groups is not limited thereto. The dimming driver 170 may activate dimming blocks belonging to any one group and provide an analog dimming signal to the activated dimming blocks. Then, the dimming driver 170 may input-activate dimming blocks belonging to another row and provide an analog dimming signal to the input-activated dimming blocks.

A driving circuit of each of the dimming blocks 200 may provide an analog driving current corresponding to the analog dimming signal to the light source module 110. The light sources 111 included in the light source module 110 may be allowed to emit light by the analog driving current. Light sources belonging to the same dimming block may emit light having the same or substantially same intensity according to dimming data. In addition, light sources belonging to different dimming blocks may emit light having different intensities according to dimming data.

Figure 10:
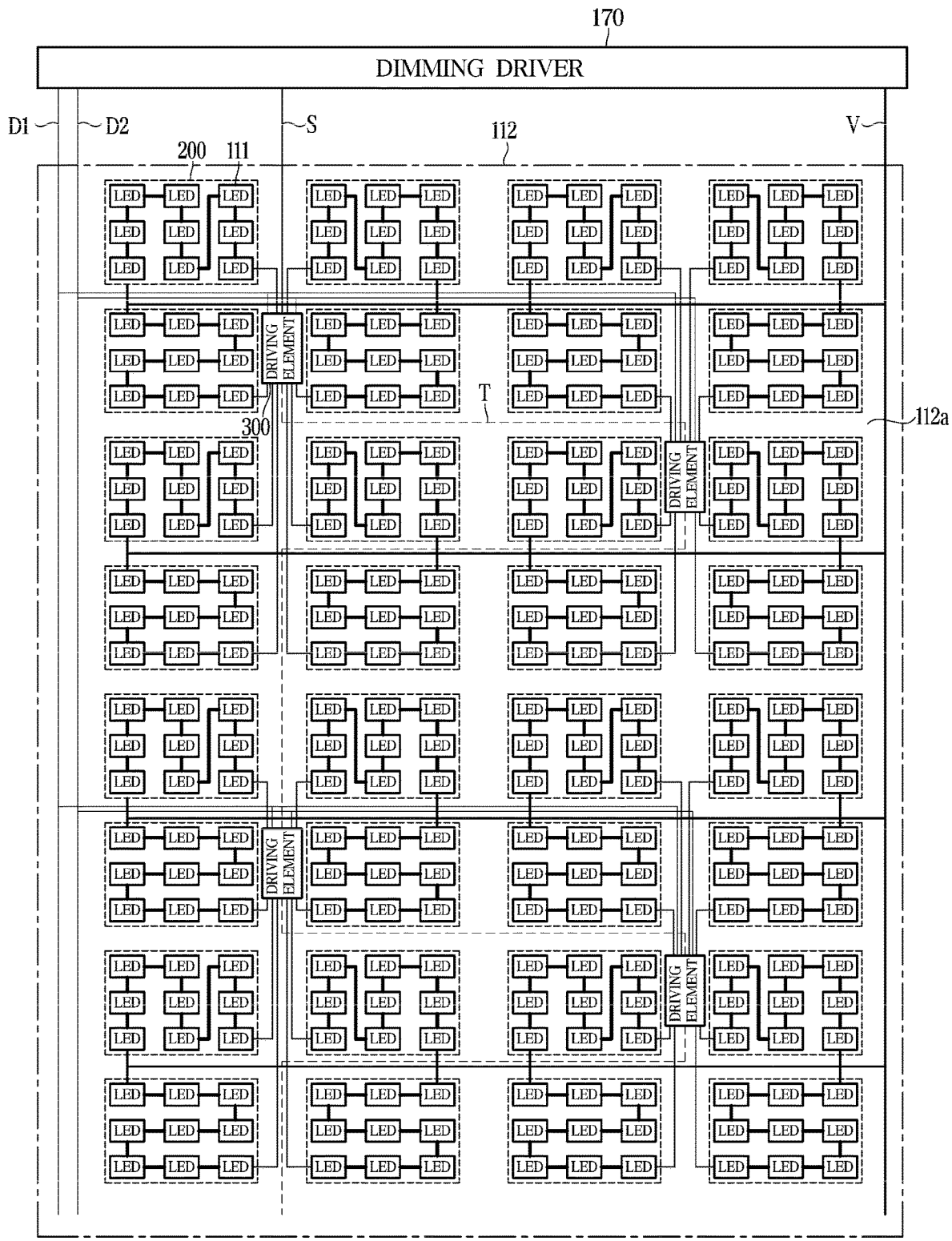
FIG. 10 is a view illustrating an example of a connection structure of a dimming driver, a driving element, and a dimming block in a display apparatus, and a line arrangement in a light source device, according to an embodiment of the disclosure.

FIG. 10 is a view illustrating an example of a connection structure of a dimming driver 170, a driving element 300, and a dimming block 200 in a display apparatus, and a line arrangement in a light source device, according to an embodiment of the disclosure.

Referring to FIG. 10, each of the plurality of dimming blocks may include a plurality of light sources (LEDs) 111 connected in series with each other. For example, the light sources (LEDs) 111 included in one dimming block 200 may be connected to the driving element 300 for light emission.

Hereinafter, for convenience of description, a light source connected to the power supply line V in each of the plurality of dimming blocks 200 is defined as a "first light source", and a light source connected to the driving element 300 is defined as a "last light source".

Among the plurality of light sources 111, connected in series, included in one dimming block 200, the first light source 111 in the series connection may be connected to the power supply line V to receive power (a driving voltage VLED), and the last light source 111 in the series connection may be connected to the driving element 300.

The driving elements 300 may, during input-activation by the dimming driver 170, receive an analog dimming signal from the dimming driver 170, and store the received analog dimming signal. In addition, the driving elements 300 may, during input-deactivation, supply a driving current corresponding to the stored analog dimming signal to the plurality of light sources (LEDs) 111.

The driving element 300 may control the driving current supplied to each of the plurality of dimming blocks 200 in a state in which the driving voltage VLED is applied to the plurality of dimming blocks 200.

To this end, the display apparatus 10 may include a plurality of scan lines S configured to provide the plurality of driving elements 300 with a scan signal, and a plurality of data lines D1 and D2 configured to provide the plurality of driving elements 300 with an analog dimming signal.

In addition, the display apparatus 10 may include a power supply line V for providing the plurality of driving elements 300 with a driving voltage.

The plurality of scan lines S, the plurality of data lines D1 and D2, and the power supply line V may be formed on the substrate 112. For example, all of the power supply line V, the scan line S, and the data lines D1 and D2 may be formed on a portion of the front surface 112a of the substrate 112.

The plurality of driving elements 300 may include circuits with various topologies to implement the active-matrix driving method.

For example, each of the plurality of driving elements 300 may include a one-capacitor two-transistor (1C2T) topology circuit. However, the circuit structure of the driving element 300 is not limited thereto. For example, the driving element 300 may include a 3T1C topology circuit in which a transistor is added to compensate for body effect of the driving transistor.

The driving element 300 may be provided in a single chip in which the driving circuit is integrated. In other words, the driving circuit may be integrated in a single semiconductor chip.

The dimming driver 170 may transmit dimming data corresponding to an input image to the plurality of driving elements 300 through the data lines D1 and D2.

In addition, the dimming driver 170 may transmit timing signals corresponding to emission timings of the plurality of dimming blocks 200 to the plurality of driving elements 300 through the scan line S.

The plurality of driving elements 300 may control the driving current supplied to each of the plurality of dimming blocks 200 based on the dimming data and the timing signal.

In FIG. 10, for convenience of depiction, only a relatively small number of dimming blocks 200 are illustrated. The display apparatus 10 may include many more dimming blocks 200 for local dimming, driving elements 300, and lines such as data lines D1 and D2, scan lines S, and a power supply line V connecting the dimming blocks 200 and the driving elements 300.

Accordingly, it is desirable to simplify the arrangement of data lines D1 and D2, scan lines S, and a power supply line V on the substrate 112.

In an embodiment, lines may include data lines D1 and D2, scan lines S, a power supply line V, lines (hereinafter referred to as "control lines") connecting the plurality of driving elements 300 and the plurality of dimming blocks 200, and lines (hereinafter referred to as "block lines") connecting the plurality of light sources, but the type of lines is not limited thereto. For example, lines may include a line (hereinafter referred to as "a timing line T") connecting the plurality of driving elements 300.

The plurality of dimming blocks 200 may be arranged in a matrix form on the front surface 112a of the substrate 112 of the light source device 100, and each of the plurality of dimming blocks 200 may include a plurality of light sources 111. The plurality of light sources 111 may be turned on by receiving all of a data signal, a scan signal, and a power signal.

A plurality of light sources 111 belonging to one dimming block 200 may be arranged in a matrix form on the front surface 112a of the substrate 112.

In one embodiment, a plurality of dimming blocks 200 included in two rows adjacent to each other among the plurality of dimming blocks 200 may be electrically connected to a power supply line V extending between the two rows.

According to an embodiment, power supply lines may be efficiently arranged by disposing only one power supply line V between two rows.

In one embodiment, the plurality of driving elements 300 may be alternately disposed between columns adjacent to each other in a matrix formed by the plurality of dimming blocks 200.

According to an embodiment, the control lines of the plurality of driving elements 300 may be provided with a reduced length. In addition, according to an embodiment, the control lines of the plurality of driving elements 300 may be alternately arranged between columns of the plurality of dimming blocks 200, and a usable wiring path may be secured between columns of the plurality of dimming blocks 200.

According to an embodiment, the timing line T connecting the plurality of driving elements 300 disposed between the first and second columns to the plurality of driving elements 300 disposed between the third and fourth columns may be formed.

In one embodiment, among the plurality of driving elements 300, driving elements 300 disposed in different columns may be electrically connected to each other through the timing line T.

According to an embodiment, each of the driving elements 300 may be connected in series with a driving element 300 adjacent thereto by the timing line T, which allows a timing signal to be shared with each other, and thus the number of data lines D1 and D2 and/or the number of scan lines S may be reduced.

In FIG. 10, a line arrangement of the light source device 100 according to a combination of all of the above-described embodiments is illustrated. However, the light source device 100 according to an embodiment may include a line arrangement implemented by each of the above-described embodiments, a combination of some of the above-described embodiments, or a combination of all of the above-described embodiments.

Figure 11:
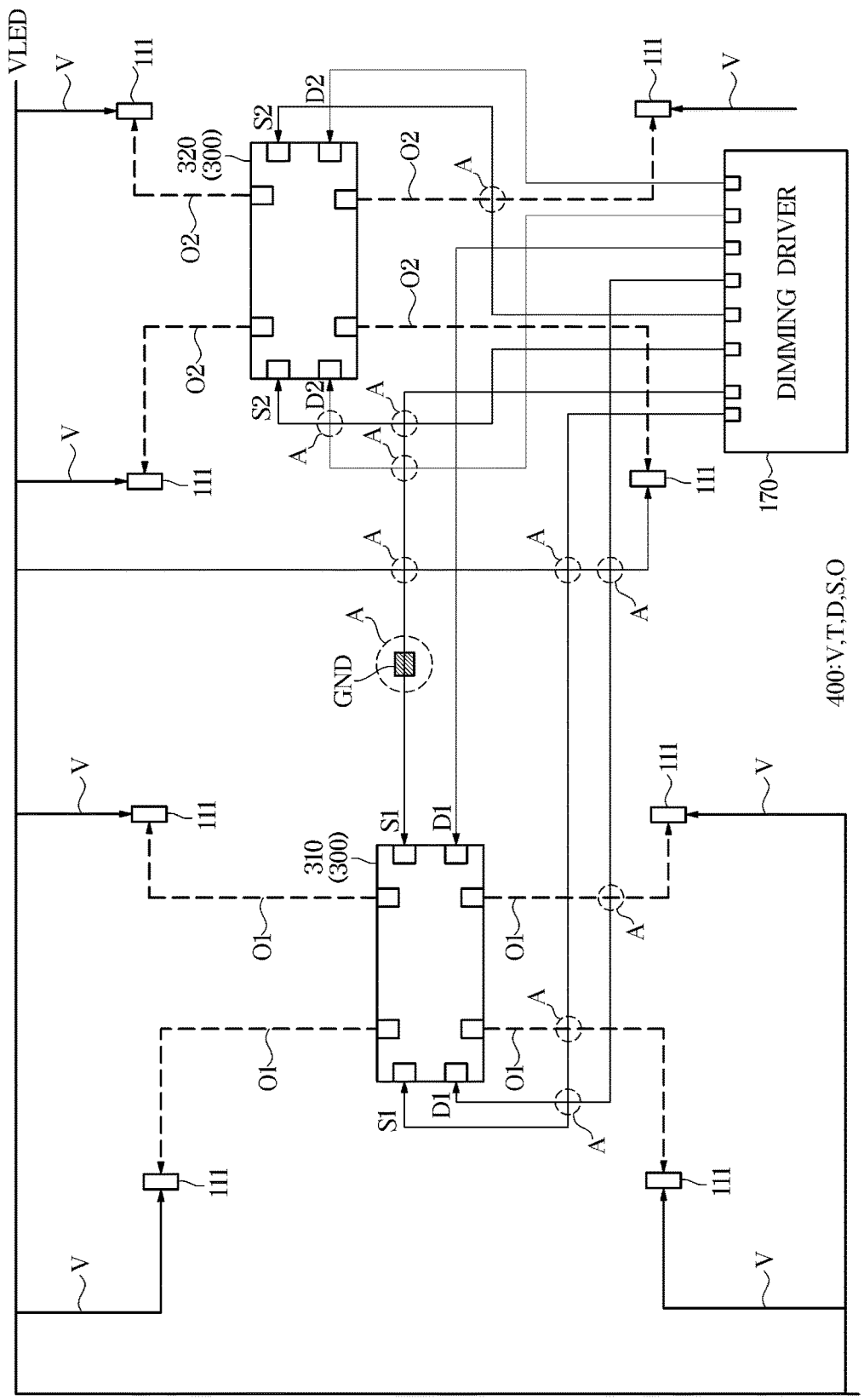
FIG. 11 is a view illustrating a line arrangement in a display apparatus according to an embodiment of the disclosure.

FIG. 11 is a view illustrating a line arrangement in a display apparatus, according to an embodiment of the disclosure. FIG. 11 is a plan view illustrating a first side (e.g. the first surface 112a) of the substrate 112. In other words, FIG. 11 shows components electrically connected on the first side of the substrate 112.

Referring to FIG. 11, the display apparatus includes at least one driving element 300 and at least one line 400.

The at least one driving element 300 may be provided as a plurality of driving elements. The plurality of driving elements 300 may include a first driving element 310 and a second driving element 320.

The at least one line 400 may be connected between the dimming driver 170, the first driving element 310 and the second driving element 320, and the light source 111 to transmit a signal. The at least one line 400 may transmit power from the dimming driver 170 including a connector to the light source 111 and the driving element 300.

The dimming driver 170 may be disposed on the light source substrate 112 or may be disposed on a separate substrate other than the light source substrate 112.

The at least one line 400 may be provided as a plurality of lines. The plurality of lines 400 may include at least one data line D, at least one scan line S, a power supply line V, a timing line T, and at least one out-line O. The at least one line 400 may include at least a portion of the feeding pad 240. The plurality of lines 400 are not limited to only the above-described lines, but may include various types of lines wired in the light source substrate 112.

The at least one data line may include a first data line D1 through which a data signal from the dimming driver 170 is transmitted to the first driving element 310 and a second data line D2 through which a data signal from the dimming driver 170 is transmitted to the second driving element 320. The first data line D1 and the second data line D2 may be provided as a plurality of first data lines and a plurality of second data lines.

The at least one scan line S may include a first scan line S1 through which a scan signal from the dimming driver 170 is transmitted to the first driving element 310 and a second scan line S2 through which a scan signal from the dimming driver 170 is transmitted to the second driving element 320. The first scan line S1 and the second scan line S2 may be provided as a plurality of first scan lines and a plurality of second scan lines.

The at least one out-line O may allow a data signal from the driving element 300 to be transmitted to the light source 111. The number of out-lines O may vary according to the scan signal and the data signal transmitted from the dimming driver 170 to the driving element 300.

The at least one out-line O may include a first out-line O1 through which a data signal from the first driving element 310 is transmitted to a first light source 111 and a second out-line O2 through which a data signal from the second driving element 320 is transmitted to a second light source 111.

The numbers of the data lines D, the scan lines S, and the out-lines O are not limited to the above example.

The lines 400 may be disposed on one side of the substrate 112. For example, the lines 400 may be formed only on one surface forming the outer side of the substrate 112, rather than on both surfaces forming the outer side of the substrate 112. For example, the lines 400 may be provided on the front surface 112a of the substrate 112. The front surface 112a may be a surface of the substrate 112 facing the display panel.

In embodiments where the lines 400 are formed only on the front surface 112a of the substrate 112, the lines 400 may cross each other. The lines 400 may cross each other at a plurality of regions (e.g. crossing regions A in FIG. 11). For example, the data line D1 or D2 for transmitting data signals from the dimming driver 170 to the driving element 300 may cross the scan line S1 or S2 for transmitting a scan signal from the dimming driver 170 to the driving element 300, or the data lines D1 and D2 may cross the power supply line V for supplying power (a driving voltage VLED) to the light source 111 and the driving element 300, or the scan line S1 or S2 may cross the power supply line V. Also, one of the out-line O, the power supply line V, the scan line S, and the data line D may be subject to a crossing.

For example, the first data line D1, the first scan line S1, and the power supply line V through which a data signal, a scan signal or power is transmitted to the first driving element 310 may cross the first out-line O1 through which a data signal is transmitted from the first driving element 310 to the first light source 111. In addition, the second data line D2, the second scan line S2, and the power supply line V through which a data signal, a scan signal or power is transmitted to the second driving element 320 may cross the second out-line O2 through which a data signal is transmitted from the second driving element 320 to the second light source 111. In addition, the line 400 connected to the first driving element 310 may cross the line 400 connected to the second driving element 320.

When the lines 400 cross each other, one of the lines 400 may be disconnected. Therefore, it is preferable to prevent the lines 400 from being disconnected such that the lines 400 may each remain electrically connected. In addition, the lines 400 may pass through the ground GND on one surface of the substrate 112, and even in this case, it is preferable to prevent the lines 400 from being disconnected.

According to one embodiment, the display apparatus may include a jumper connector 500. For example, the backlight unit 100 may include the jumper connector 500. The display apparatus may prevent the line 400 from being disconnected using the jumper connector 500. The jumper connector 500 may be provided as a plurality of jumper connectors. Details are described below.

The line 400 may include a first line, a second line, a third line, and a fourth line. For example, the first line may be the data line D, the second line may be the scan line S, the third line may be the power supply line V, and the fourth line may be the out-line O. However, it is not limited to the above example, and the first line may be a scan line S, a power supply line V, or an out-line O, or may be yet another line. Also, the second line may be a data line D, a power supply line V, or an out-line O, or may be yet another line. Also, the third line may be a data line D, a scan line S, or an out-line O, or may be yet another line. Also, the fourth line may be a data line D, a scan line S, a power supply line V, or may be yet another line.

In addition, although not shown, various board components, such as capacitors, resistors, and connectors, as well as the line 400, the light source 111, and the driving element 300 may be disposed on the substrate 112. The line 400 may include all lines 400 for electrically connecting the light source 111, the driving element 300, the capacitor, the resistor, the connector, and the like described above.

In embodiments where the substrate 112 of the display apparatus according to an embodiment may have the above-described various components disposed only on the first surface facing the display panel 20 among the outer side surfaces, the jumper connector 500 may be used to prevent a disconnection of the lines 400 electrically connecting the components to each other. Accordingly, there is no need to process both sides of the outer side surfaces of the substrate 112 to avoid disconnection, leading to enhanced process efficiency.

Figure 12:
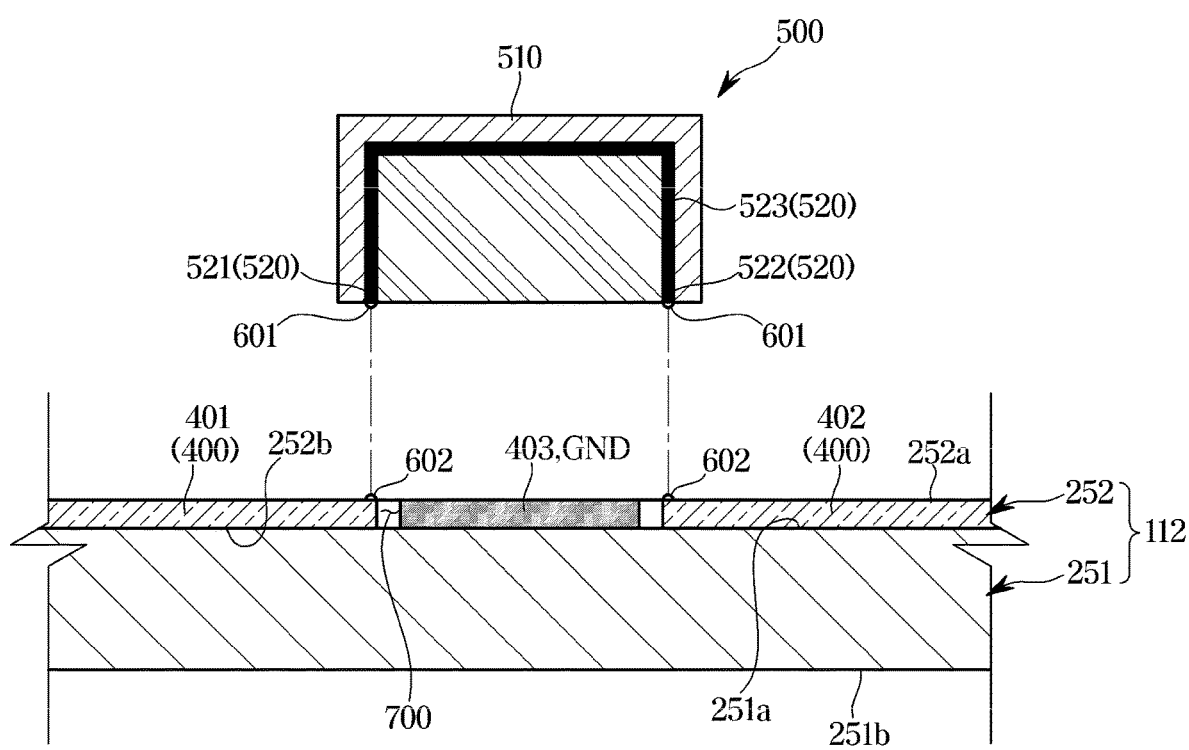
FIGS. 12 to 14 are views illustrating a state in which a jumper connector is electrically connected to a substrate in a display apparatus, according to an embodiment of the disclosure.
Figure 13:
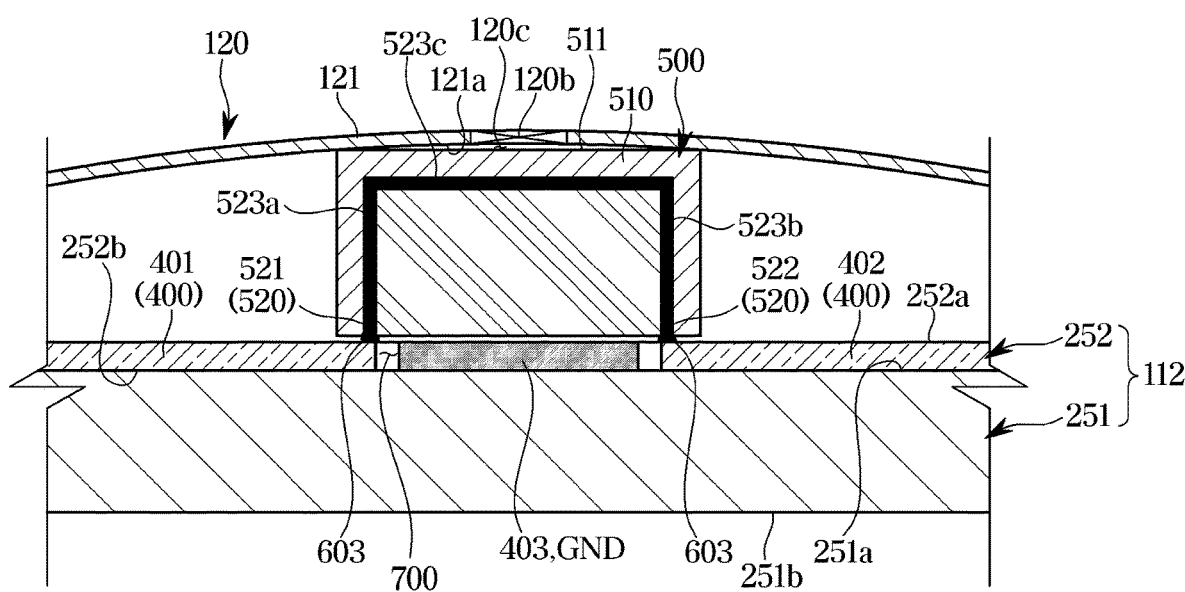
Figure 14:
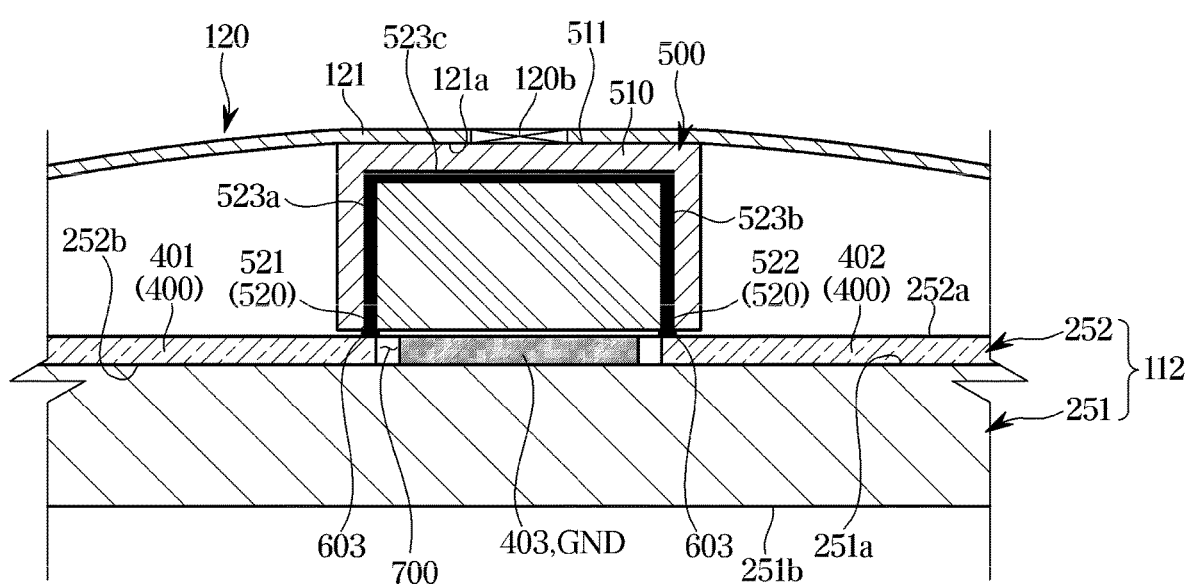

FIGS. 12 to 14 are views illustrating a state in which a jumper connector 500 is electrically connected to a substrate 112 in a display apparatus, according to an embodiment of the disclosure.

Referring to FIGS. 12 to 14, a display apparatus according to an embodiment includes a substrate 112, a jumper connector 500 electrically connected to the substrate 112, and a line 400 provided on the substrate 112.

The substrate 112 includes an insulation layer 251 and a conduction layer 252. In addition, the substrate 112 may include a protective layer (253 in FIGS. 6 and 7). Since the protective layer 253 need not be formed in an area in which the jumper connector 500 is mounted, its illustration is omitted from FIGS. 12 to 14.

The substrate 112 includes a plurality of layers, and may include a plurality of outer surfaces provided on the outside of the plurality of layers. The substrate 112 may include a first side facing the display panel and a second side opposite to the first side. The outer surfaces of the substrate 112 may include a first surface 252a and a second surface 251b. The first surface 252a and the second surface 251b may be disposed on opposite sides. The first surface 252a may be a front surface of the substrate 112, and the second surface 251b may be a rear surface of the substrate 112. The first surface 252a may be a front surface of the conduction layer 252, and the second surface 251b may be a rear surface of the insulation layer 251. The first surface 252a may be a surface facing the display panel.

The line 400 may be a part of the conduction layer 252. The line 400 may be formed only on the first side of the substrate 112. That is, in order to form the line 400 in the substrate 112, the conduction layer 252 may be formed only on one side of the substrate 112, rather than on both sides of the outer surface. For example, the line 400 may be formed on the first surface 252a.

In this illustrated embodiment, since the lines 400 are wired only on the first side of the substrate 112, the lines 400 might cross each other.

When the lines 400 cross each other, one of the lines 400 may be disconnected. In order to electrically connect the disconnected line 400, the jumper connector 500 may be used. The jumper connector 500 may be disposed in a portion or region at which the lines 400 cross each other, which may be termed a crossing region. For example, when the data line D and the scan line S cross each other, since one line 400 between the data line D and the scan line S may be disconnected, the jumper connector 500 may be disposed in a portion or region at which the data line D and the scan line S cross each other.

The jumper connector 500 electrically connects with one line of the lines 400 (which may be termed a first line, or connected line, corresponding to the jumper connector 500) and guides another line 403 of the lines 400 (which may be termed a second line, or guided line, corresponding to the jumper connector 500) to be spaced apart from the first line of the lines 400. For example, the jumper connector 500 may electrically connect the data line D while guiding the scan line S to be spaced apart from the data line D, or may electrically connect the scan line S while guides the data line D to be spaced apart from the scan line S.

Each of the lines 400 may include a first portion 401 and a second portion 402. For example, each of the data line D, the scan line S, the power supply line V, and the out-line O may be divided into a first portion 401 and a second portion 402. The first portion 401 and the second portion 402 may be spaced apart from each other in the conduction layer 252 of the substrate 112. The jumper connector 500 may electrically connect the first portion 401 and the second portion 402. For example, when the data line D is divided into a first portion 401 and a second portion 402, the jumper connector 500 may electrically connect the first portion 401 and the second portion 402, and may space one of the scan line S, the power supply line V, and the out-line O apart from the data line D.

The jumper connector 500 may include a body 510 and a wire portion 520 formed in the body 510.

The wire portion 520 may electrically connect one of the lines 400. For example, when a line 400 is disconnected from a crossover, the wire portion 520 may connect the disconnected line 400.

The wire portion 520 may include a first point 521 connected to the first portion 401 of the disconnected line 400, a second point 522 connected to the second portion 402 of the disconnected line 400, and a connection portion 523 connecting the first point 521 and the second point 522.

A circuit line may be formed in the wire portion 520 and the connection portion 523. The connection portion 523 may include a first connection portion 523a, a second connection portion 523b, and a third connection portion 523c. The first connection portion 523a may be connected to the first point 521, the second connection portion 523b may be connected to the second point 522, and the third connection portion 523c may connect the first connection portion 523a and the second connection portion 523b. Accordingly, the first connection portion 523a, the second connection portion 523b, and the third connection portion 523c may be connected to each other, and thus the first portion 401 and the second portion 402 of the line 400 may be allowed to be electrically connected to each other through the connection portion 523.

In the embodiment illustrated in FIG. 12, the first connection portion 523a and the second connection portion 523b are formed to be substantially parallel to each other within opposite sides of the body 510, and the third connection portion 523c is formed substantially perpendicular to the first connection portion 523a and the second connection portion 523b. However, the connection portions 523 are not limited to the shape of the above example and may be provided in various shapes and numbers as long as they can collectively connect the first portion 401 and the second portion 402 of the line 400.

The jumper connector 500 may connect one end of the first portion 401 to one end of the second portion 402. As shown in the embodiment illustrated in FIG. 12, the jumper connector 500 may be moved toward the substrate 112 from the front side and electrically connected to the line 400.

The first point 521 of the wire portion 520 may be soldered to the first portion 401 of the line 400, and the second point 522 of the wire portion 520 may be soldered to the second portion 402 of the line 400. For example, a first soldering portion 601 may be provided on the first point 521 and the second point 522, and a second soldering portion 602 may be provided on the one end of the first portion 401 and the one end of the second portion 402. As shown in the embodiments illustrated in FIGS. 13 and 14, the first soldering portion 601 and the second soldering portion 602 may be soldered to form an electrical connection 603.

Therefore, since the first portion 401 of the line 400 and the wire portion 520 are electrically connected, and the second portion 402 of the line 400 and the wire portion 520 are electrically connected, the first portion 401 and the second portion 402 are electrically connected to each other and thus an electrical signal may flow through the line 400.

When the jumper connector 500 electrically connects the first portion 401 and the second portion 402 of the line 400, the jumper connector 500 may be spaced apart from the substrate 112. For example, the jumper connector 500 and the insulation layer 251 may be spaced apart from each other such that a space 700 may be provided between the jumper connector 500 and the insulation layer 251. The space 700 may be a region in which the first portion 401 and the second portion 402 of the line 400 are disposed on opposite sides of the space 700 and thereby disconnected from each other.

When lines 400 cross each other (see FIG. 11), one of the lines 400 may be electrically connected by the jumper connector 500, and the other line 403 of the lines 400 may be disposed in the space 700 formed between the jumper connector 500 and the insulation layer 251. Thus, the one of the lines 400 and the other one 403 may be wired without interfering with each other.

The jumper connector 500 need not be limited only to use with regard to the lines 400, but may also be used with regard to the ground GND. For example, when a line 400 is wired to the substrate 112, it is not desirable for the line 400 to bypass the ground GND. In this case, the line 400 may be wired over the ground GND through the jumper connector 500.

According to an embodiment, components including the line 400 and the ground GND may be formed on only one side of the outer surface of the substrate 112. Accordingly, wiring of components may be performed only on one surface of the substrate 112 rather than on both surfaces of the substrate 112, which leads to enhanced processing efficiency.

As shown in the embodiments illustrated in FIGS. 13 and 14, since the jumper connector 500 may be formed in a black color, a reflective sheet 120 having a white based color may be disposed on a front side of the jumper connector 500 to cover the jumper connector 500 and thereby prevent "Mura" (non-uniformity). The reflective sheet 120 may be attached to the jumper connector 500. For example, an adhesive surface 121a of the reflective sheet 120 may be bonded to a front surface 511 of the body 510 of the jumper connector 500.

In this case, there may be a space 120c formed by air between the reflective sheet 120 and the jumper connector 500 (see FIG. 13), which separates the reflective sheet 120 and the jumper connector 500 and may impede adhesion. Accordingly, an adhesive portion 121 of the reflective sheet 120 may be provided with an air discharge portion 120b such that the air in the space 120c between the reflective sheet 120 and the jumper connector 500 may be discharged, to eliminate the space 120c and stably bond the reflective sheet 120 and the jumper connector 500 (see FIG. 14).

The air discharge portion 120b may have various shapes. For example, the air discharge portion 120b may have a slit shape. The shape of the air discharge portion 120b is not limited to the above example as long as it is formed on the adhesive portion 121 of the reflective sheet 120.

The adhesive portion 121 of the reflective sheet 120 may be provided in an area corresponding to the jumper connector 500. For example, the adhesive portion 121 may be formed to correspond to the front surface 511 of the body 510.

FIGS. 15 to 22 are views illustrating an arrangement relationship between lines in a display apparatus, in which a crossing area or crossing region "A" shown in FIG. 11 is enlarged and schematically illustrated, according to an embodiment of the disclosure.

Referring to FIG. 11, in embodiments where the lines 400 are wired only on the first side of the substrate 112 in the display apparatus, crossings may occur between the lines 400. In this case, the jumper connector 500 may allow the line 400 to be connected without being disconnected. The display apparatus may include the jumper connector 500. The jumper connector 500 may be as a plurality of jumper connectors. The jumper connectors 500 may be disposed in respective areas A.

Figure 15:
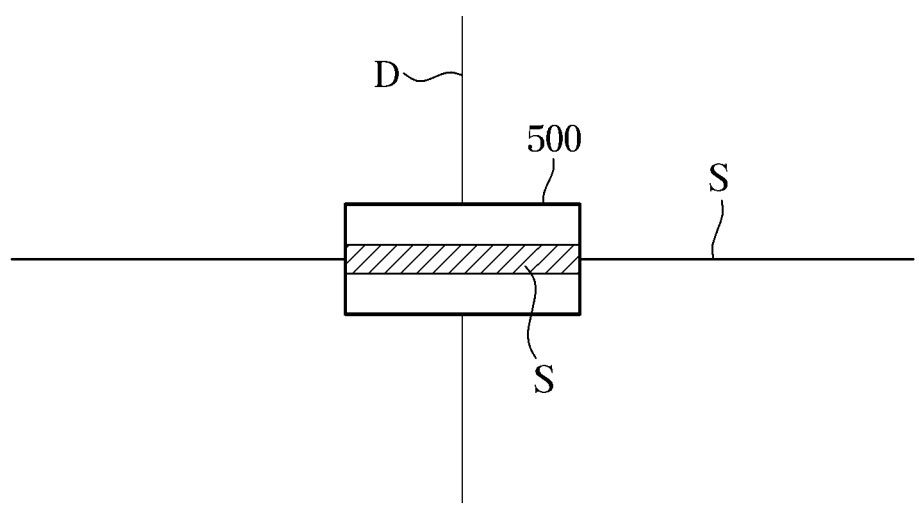
FIGS. 15 to 22 are views illustrating an arrangement relationship between lines in a display apparatus, in which an area "A" of FIG. 11 is enlarged and schematically shown; according to an embodiment of the disclosure.

Referring to FIG. 15, a data line D and a scan line S may cross each other. In this case, as shown in the embodiments illustrated in FIGS. 12 to 14, the scan line S may include a first portion 401 and a second portion 402, and the first portion 401 and the second portion 402 may be connected to each other through a jumper connector 500. The scan line S may be wired in the jumper connector 500. For example, the first portion 401 and the second portion 402 of the scan line S may be connected to each other through the wire portion 520.

The data line D may be spaced apart from the scan line S. The data line D may pass through the space 700 between the jumper connector 500 and the insulation layer 251. For example, in embodiments where the jumper connector 500 is disposed on the conduction layer 252, the space 700 may be formed between the jumper connector 500 and the insulation layer, and the data line D may be wired in the space 700.

In this case, the jumper connector 500 connecting the first portion 401 and the second portion 402 of the scan line S while allowing the data line D to pass between the jumper connector 500 and the insulation layer 251 may be referred to as a first jumper connector 500.

Figure 16:
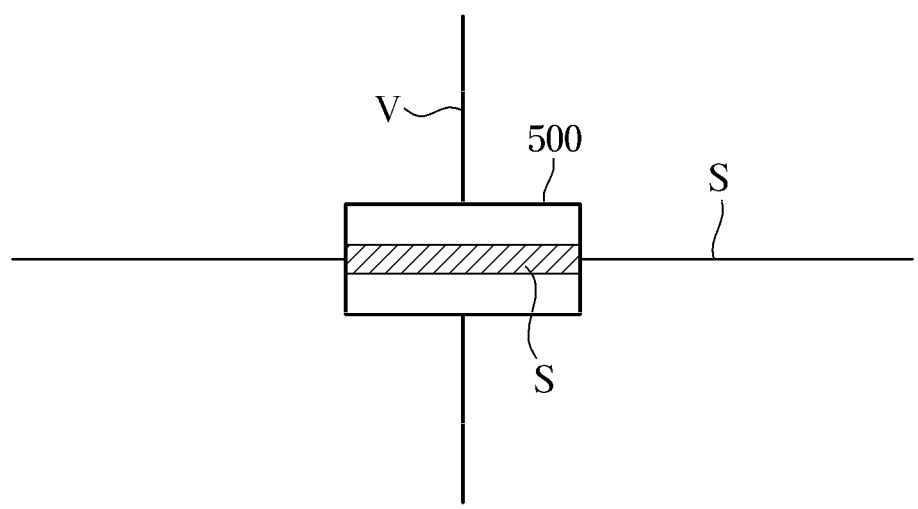

Referring to FIG. 16, a power supply line V and a scan line S may cross each other. In this case, the scan line S may include a first portion 401 and a second portion 402, and the first portion 401 and the second portion 402 may be connected to each other through a jumper connector 500. The scan line S may be wired in the jumper connector 500. For example, the first portion 401 and the second portion 402 of the scan line S may be connected to each other through the wire portion 520.

As shown in the embodiments illustrated in FIGS. 12 to 14, the power supply line V may pass through the space 700 between the jumper connector 500 and the insulation layer 251. The power supply line V may be spaced apart from the scan line S.

In this case, the jumper connector 500 connecting the first portion 401 and the second portion 402 of the scan line S while allowing the power supply line V to pass between the jumper connector 500 and the insulation layer 251 may be referred to as a second jumper connector 500.

Figure 17:
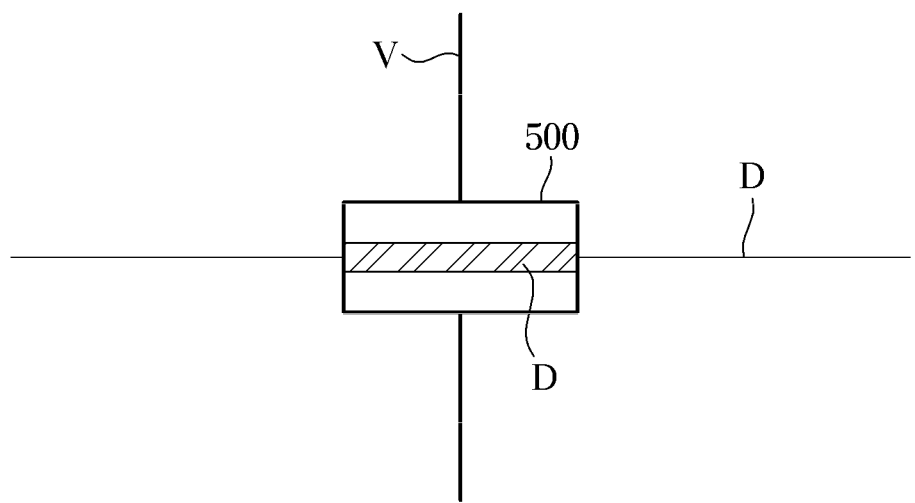

Referring to FIG. 17, a power line V and a data line D may cross each other. In this case, the data line D may include a first portion 401 and a second portion 402, and the first portion 401 and the second portion 402 may be connected to each other through a jumper connector 500. The data line D may be wired in the jumper connector 500. For example, the first portion 401 and the second portion 402 of the scan line S may be connected to each other through the wire portion 520.

As shown in the embodiments illustrated in FIGS. 12 to 14, the power supply line V may pass through the space 700 between the jumper connector 500 and the insulation layer 251. The power supply line V may be spaced apart from the data line D.

In this case, the jumper connector 500 connecting the first portion 401 and the second portion 402 of the data line D while allowing the power supply line V to pass between the jumper connector 500 and the insulation layer 251 may be referred to as a third jumper connector 500.

Figure 18:
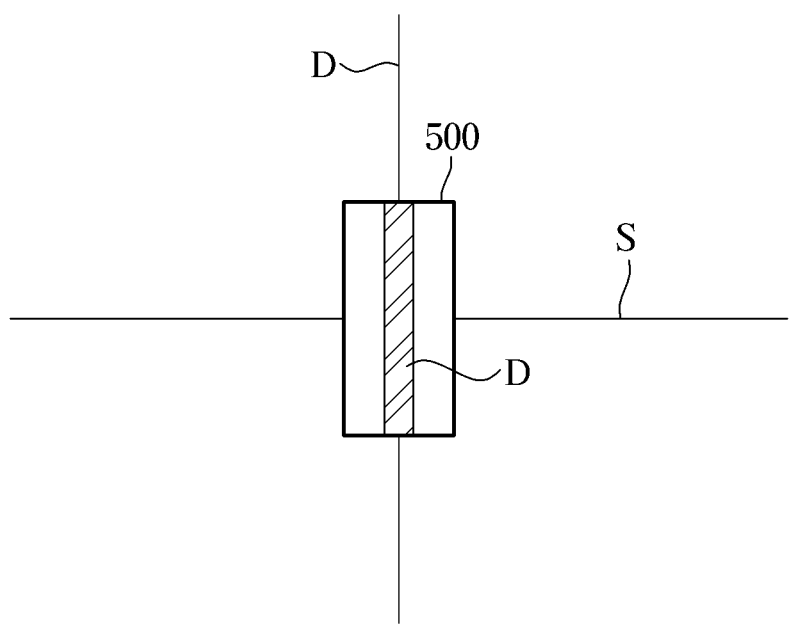

Referring to FIG. 18, a data line D and a scan line S may cross each other. In this case, the data line D may include a first portion 401 and a second portion 402, and the first portion 401 and the second portion 402 may be connected to each other through a jumper connector 500. The data line D may be wired in the jumper connector 500. For example, the first portion 401 and the second portion 402 of the data line D may be connected to each other through the wire portion 520.

Referring to FIGS. 12 to 14, the scan line S may pass through the space 700 between the jumper connector 500 and the insulation layer 251. The scan line S may be spaced apart from the data line D.

In this case, the jumper connector 500 connecting the first portion 401 and the second portion 402 of the data line D while allowing the scan line S to pass between the jumper connector 500 and the insulation layer 251 may also be referred to as a first jumper connector 500 as in the case of the jumper connector shown in FIG. 15.

Figure 19:
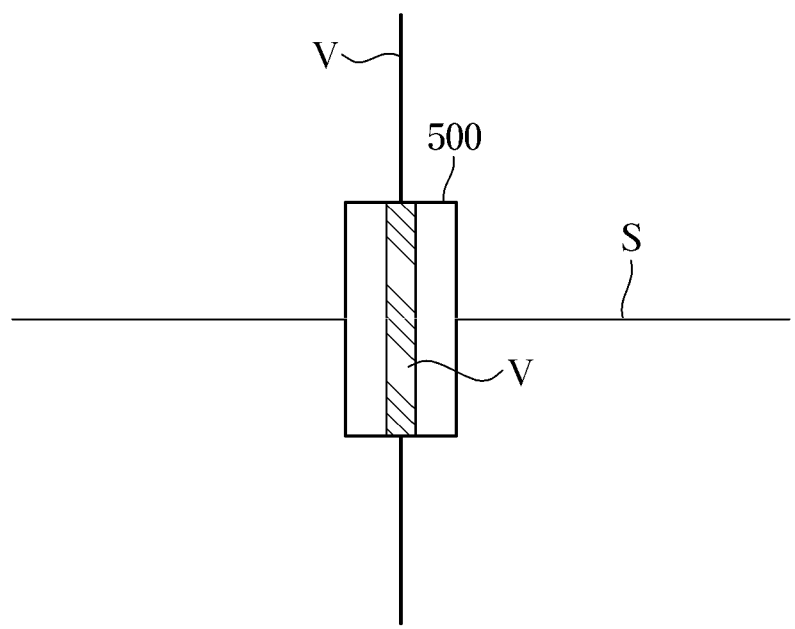

Referring to FIG. 19, a power supply line V and a scan line S may cross each other. In this case, the power supply line V may include a first portion 401 and a second portion 402, and the first portion 401 and the second portion 402 may be connected to each other through a jumper connector 500. The power supply line V may be wired in the jumper connector 500. For example, the first portion 401 and the second portion 402 of the power supply line V may be connected to each other through the wire portion 520.

As shown in the embodiments illustrated in FIGS. 12 to 14, the scan line S may pass through the space 700 between the jumper connector 500 and the insulation layer 251. The scan line S may be spaced apart from the power supply line V.

In this case, the jumper connector 500 connecting the first portion 401 and the second portion 402 of the power supply line V while allowing the scan line S to pass between the jumper connector 500 and the insulation layer 251 may also be referred to as a second jumper connector 500 as in the case of the jumper connector shown in FIG. 16.

Figure 20:
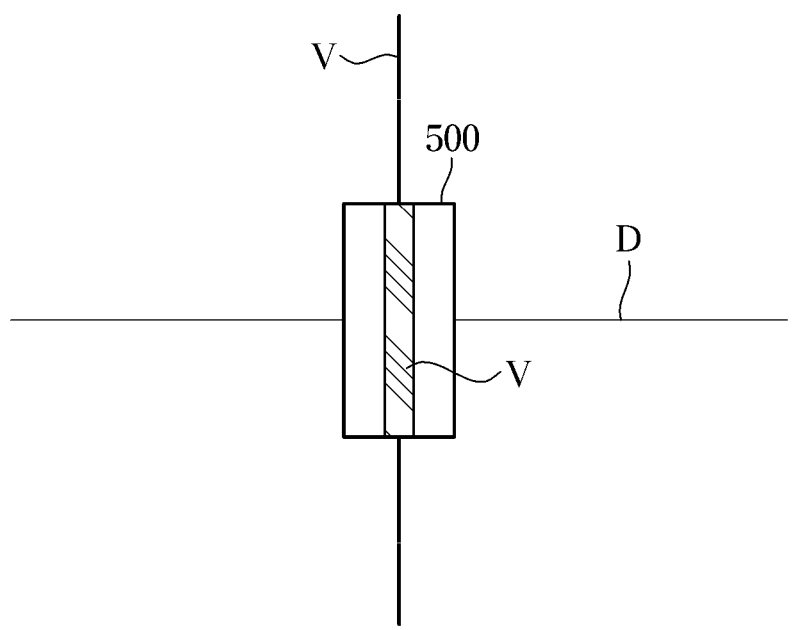

Referring to FIG. 20, a power supply line V and a data line D may cross each other. In this case, the power supply line V may include a first portion 401 and a second portion 402, and the first portion 401 and the second portion 402 may be connected to each other through a jumper connector 500. The power supply line V may be wired in the jumper connector 500. For example, the first portion 401 and the second portion 402 of the power supply line V may be connected to each other through the wire portion 520.

As shown in the embodiments illustrated in FIGS. 12 to 14, the data line D may pass through the space 700 between the jumper connector 500 and the insulation layer 251. The data line D may be spaced apart from the power supply line V.

In this case, the jumper connector 500 connecting the first portion 401 and the second portion 402 of the power supply line V while allowing the data line D to pass between the jumper connector 500 and the insulation layer 251 may also be referred to as a third jumper connector 500 as in the case of the jumper connector shown in FIG. 17.

Figure 21:
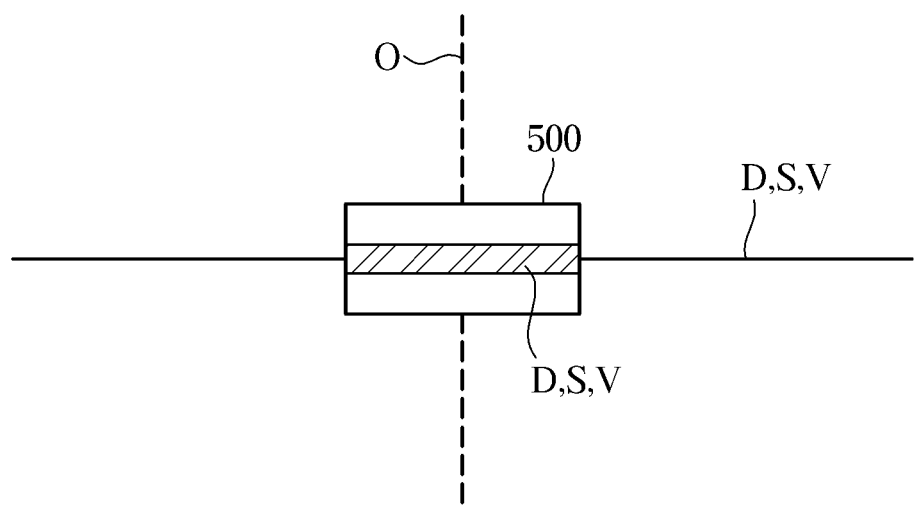

Referring to FIG. 21, an out-line O may cross one of a data line D, a scan line S and a power supply line V. In this case, the one of the data line D, the scan line S and the power supply line V may include a first portion 401 and a second portion 402, and the first portion 401 and the second portion 402 may be connected to each other through a jumper connector 500. The one of the data line D, the scan line S and the power supply line V may be wired in the jumper connector 500. For example, the first portion 401 and the second portion 402 of the one of the data line D, the scan line S and the power supply line V may be connected to each other through the wire portion 520.

As shown in the embodiments illustrated in FIGS. 12 to 14, the out-line O may pass through the space 700 between the jumper connector 500 and the insulation layer 251. The out-line O may be spaced apart from the one of the data line D, the scan line S and the power supply line V.

In this case, the jumper connector 500 connecting the first portion 401 and the second portion 402 of the one of the data line D, the scan line S and the power supply line V while allowing the out-line D to pass between the jumper connector 500 and the insulation layer 251 may be referred to as a fourth jumper connector 500.

Figure 22:
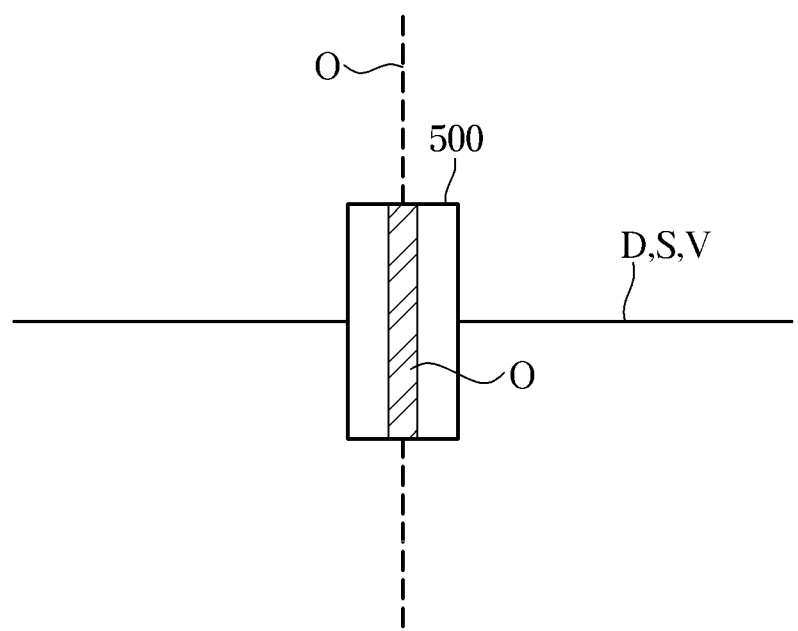

Referring to FIG. 22, one of a data line D, a scan line S and a power supply line V may cross an out-line O. In this case, the out-line O may include a first portion 401 and a second portion 402, and the first portion 401 and the second portion 402 may be connected to each other through a jumper connector 500. The out-line O may be wired in the jumper connector 500. For example, the first portion 401 and the second portion 402 of the out-line O may be connected to each other through the wire portion 520.

As shown in the embodiments illustrated in FIGS. 12 to 14, the one of the data line D, the scan line S and the power supply line V may pass through the space 700 between the jumper connector 500 and the insulation layer 251. The one of the data line D, the scan line S and the power supply line V may be spaced apart from the out-line O.

In this case, the jumper connector 500 connecting the first portion 401 and the second portion 402 of the out-line O while allowing the one of the data line D, the scan line S and the power supply line V to pass between the jumper connector 500 and the insulation layer 251 may be referred to as a fourth jumper connector 500 as in the case of the jumper connector 500 shown in FIG. 21.

Although it is not shown that the timing line T crosses one of the out-line O, the power supply line V, the scan line S, and the data line D, the jumper connector 500 may also be used when the timing line T crosses one of the out-line O, the power supply line V, the scan line S, and the data line D.

Although exemplary embodiments of the disclosure have been described for illustrative purposes, those skilled in the art will appreciate that various modifications, additions and substitutions are possible, without departing from the scope and spirit of the disclosure. Therefore, exemplary embodiments of the disclosure have not been described for limiting purposes.

What is claimed is:
1. A display apparatus comprising:
a display panel; and
a backlight unit configured to provide light to the display panel,
wherein the backlight unit comprises:
    a substrate including a first surface facing the display panel;
    a light source disposed on the first surface;
    a driving element disposed on the first surface to drive the light source;
    a plurality of lines provided on the first surface, the plurality of lines including a scan line providing a scan signal to the driving element, a data line providing a data signal to the driving element, a power supply line providing a power signal to the light source, and an out-line providing a signal from the driving element to the light source; and
    at least one jumper connector disposed on the first surface,
wherein each of the at least one jumper connector corresponds to a first line and a second line of the plurality of lines, such that:
    the jumper connector is disposed in a crossing region of the first surface at which the first line crosses the second line, and
    the jumper connector electrically connects with the first line and guides the second line to be spaced apart from the first line,
wherein the at least one jumper connector comprises a first jumper connector and a second jumper connector,
wherein the first line of the first jumper connector is wired in the first jumper connector, and the first line of the second jumper connector is wired in the second jumper connector, and
wherein one line of the scan line, the data line, the power supply line and the out-line corresponds to the first line of the first jumper connector, and an other of the scan line, the data line, the power supply line and the out-line corresponds to the first line of the second jumper connector.

2. The display apparatus of claim 1,
wherein the at least one jumper connector further comprises a third jumper connector,
wherein one line of the data line and the scan line is the first line corresponding to the third jumper connector, and an other line of the data line and the scan line is the second line corresponding to the third jumper connector.

3. The display apparatus of claim 1,
wherein the substrate comprises an insulation layer and a conduction layer stacked on a surface of the insulation layer,
wherein a ground is formed on the surface of the insulation layer on which the conduction layer is stacked, and
wherein the ground is disposed between the insulation layer and the jumper connector.

4. The display apparatus of claim 1, wherein each of the at least one jumper connector comprises:
a body, and
a wire portion formed in the body to electrically connect one of the lines,
wherein the wire portion comprises:
    a first point connected to a first portion of the first line corresponding to the jumper connector,
    a second point connected to a second portion of the first line corresponding to the jumper connector, and a connection portion formed inside the body to electrically connect the first point and the second point.

5. The display apparatus of claim 4, wherein
the first line corresponding to the jumper connector is disconnected and divided into the first portion and the second portion, and
the first portion and the second portion of the first line corresponding to the jumper connector are electrically connected by the jumper connector.

6. The display apparatus of claim 1,
wherein the substrate comprises an insulation layer and a conduction layer stacked on the insulation layer,
wherein a space is formed in the conduction layer of the substrate between the at least one jumper connector and the insulation layer,
wherein a first portion and a second portion of the first line are disposed on opposite sides of the space, and
wherein the second line corresponding to the at least one jumper connector is disposed in the space.

7. The display apparatus of claim 1, wherein the substrate comprises an insulation layer and a conduction layer stacked on the insulation layer, and
the second line of the first jumper connector passes between the first jumper connector and the insulation layer.

8. The display apparatus of claim 7, wherein the second line of the second jumper connector passes between the first jumper connector and the insulation layer.

9. A display apparatus comprising:
a display panel; and
a backlight unit configured to provide light to the display panel,
wherein the backlight unit comprises:
a substrate including a first surface facing the display panel;
a light source disposed on the first surface;
a driving element disposed on the first surface to drive the light source;
a plurality of lines provided on the first surface, the plurality of lines including a scan line providing a scan signal to the driving element, a data line providing a data signal to the driving element, a power supply line providing a power signal to the light source, and an out-line providing a signal from the driving element to the light source; and
at least one jumper connector disposed on the first surface, and
wherein each of the at least one jumper connector corresponds to a first line and a second line of the plurality of lines, such that:
the jumper connector is disposed in a crossing region of the first surface at which the first line crosses the second line, and
the jumper connector electrically connects with the first line and guides the second line to be spaced apart from the first line,
wherein the at least one jumper connector comprises a first jumper connector and a second jumper connector,
wherein one line of the data line and the scan line is the first line corresponding to the first jumper connector, and an other line of the data line and the scan line is the second line corresponding to the first jumper connector
wherein one line of the power supply line and the scan line is the first line corresponding to the second jumper connector, and an other line of the power supply line and the scan line is the second line corresponding to the second jumper connector.

10. The display apparatus of claim 9, wherein the at least one jumper connector further comprises a third jumper connector, and
wherein one line of the power supply line and the data line is the first line corresponding to the third jumper connector, and an other line of the power supply line and the data line is the second line corresponding to the third jumper connector.

11. The display apparatus of claim 10,
wherein the substrate comprises an insulation layer and a conduction layer stacked on the insulation layer,
wherein the data line passes between the first jumper connector and the insulation layer, and
wherein the scan line is wired in the first jumper connector.

12. The display apparatus of claim 11,
wherein the power supply line passes between the second jumper connector and the insulation layer, and
wherein the scan line is wired in the second jumper connector.

13. The display apparatus of claim 12,
wherein the power supply line passes between the third jumper connector and the insulation layer, and
wherein the data line is wired in the third jumper connector.

14. The display apparatus of claim 10,
wherein the substrate comprises an insulation layer and a conduction layer stacked on the insulation layer,
wherein the scan line passes between the first jumper connector and the insulation layer, and
wherein the data line is wired in the first jumper connector.

15. The display apparatus of claim 14,
wherein the scan line passes between the second jumper connector and the insulation layer, and
wherein the power supply line is wired in the second jumper connector.

16. The display apparatus of claim 15,
wherein the data line passes between the third jumper connector and the insulation layer, and
wherein the power supply line is wired in the third jumper connector.

17. A display apparatus comprising:
a display panel; and
a backlight unit configured to provide light to the display panel,
wherein the backlight unit comprises:
a substrate including a first surface facing the display panel;
a light source disposed on the first surface;
a driving element disposed on the first surface to drive the light source;
a plurality of lines provided on the first surface, the plurality of lines including a scan line providing a scan signal to the driving element, a data line providing a data signal to the driving element, a power supply line providing a power signal to the light source, and an out-line providing a signal from the driving element to the light source; and
at least one jumper connector disposed on the first surface,
wherein the display apparatus further comprises a reflective sheet disposed on the first surface of the substrate to cover the at least one jumper connector,
wherein each of the at least one jumper connector corresponds to a first line and a second line of the plurality of lines, such that:

the jumper connector is disposed in a crossing region of the first surface at which the first line crosses the second line, and the jumper connector electrically connects with the first line and guides the second line to be spaced apart from the first line, and wherein an air discharge portion is formed on the reflective sheet and configured to eliminate a space separating the reflective sheet and the at least one jumper connector.

18. The display apparatus of claim 17, wherein the at least one jumper connector comprises a body including a front surface facing the display panel, and wherein the air discharge portion is formed in an area of the reflective sheet corresponding to the front surface of the body of the at least one jumper connector.

\* \* \* \* \*